(12) United States Patent
Park et al.

(10) Patent No.: US 11,387,306 B2
(45) Date of Patent: Jul. 12, 2022

(54) DISPLAY DEVICE

(71) Applicant: Samsung Display Co., Ltd., Yongin-si (KR)

(72) Inventors: Jun Hyun Park, Yongin-si (KR); Dong Woo Kim, Yongin-si (KR); Sung Jae Moon, Yongin-si (KR); Kang Moon Jo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 48 days.

(21) Appl. No.: 16/815,778

(22) Filed: Mar. 11, 2020

(65) Prior Publication Data
US 2020/0343326 A1 Oct. 29, 2020

(30) Foreign Application Priority Data

Apr. 24, 2019 (KR) ........................ 10-2019-0047872

(51) Int. Cl.
H01L 27/32 (2006.01)
G09G 3/3266 (2016.01)
H01L 27/02 (2006.01)

(52) U.S. Cl.
CPC ....... H01L 27/3272 (2013.01); G09G 3/3266 (2013.01); H01L 27/0266 (2013.01); H01L 27/0288 (2013.01); H01L 27/0292 (2013.01); H01L 27/0296 (2013.01); H01L 27/3276 (2013.01); G09G 2330/04 (2013.01)

(58) Field of Classification Search
CPC ............. G09G 2330/04; G09G 3/3233; G09G 3/3266; H01L 27/0266; H01L 27/0288; H01L 27/0292; H01L 27/0296; H01L 27/1255; H01L 27/3272; H01L 27/3276

See application file for complete search history.

(56) References Cited

U.S. PATENT DOCUMENTS

| 10,236,330 | B2 | 3/2019 | Maruyama | |
|---|---|---|---|---|
| 2015/0206929 | A1* | 7/2015 | Sato | H01L 51/5012 257/40 |
| 2016/0343980 | A1* | 11/2016 | Lee | H01L 51/5246 |
| 2016/0372497 | A1* | 12/2016 | Lee | H01L 27/1222 |
| 2017/0278916 | A1* | 9/2017 | Maruyama | H01L 27/3262 |
| 2018/0337226 | A1* | 11/2018 | Liu | H01L 27/3246 |

(Continued)

FOREIGN PATENT DOCUMENTS

JP 2017-173505 9/2017

Primary Examiner — Mohammed Shamsuzzaman
(74) Attorney, Agent, or Firm — Kile Park Reed & Houtteman PLLC

(57) ABSTRACT

A display device may include a substrate including a display area and a non-display area, pixels provided in the display area and each pixel including a pixel transistor and a light emitting element connected to the pixel transistor, a first driver provided in the non-display area and configured to provide a scan signal to the pixel, a scan line configured to transfer the scan signal to the pixel, a first fan-out line provided in the non-display area and connected to the scan line, and a first electrostatic discharge portion provided in the non-display area and located between the first fan-out line and the scan line. The first electrostatic discharge portion may include a bottom metal layer disposed on the substrate and a transistor disposed on and electrically connected to the bottom metal layer.

30 Claims, 16 Drawing Sheets

(56) References Cited

U.S. PATENT DOCUMENTS

2019/0317372 A1* 10/2019 Tsai .................... G02F 1/13394
2020/0243021 A1*  7/2020 Li ........................ G09G 3/3275
2021/0313410 A1* 10/2021 Kim .................... H01L 27/3276

* cited by examiner

DISPLAY DEVICE

CROSS REFERENCE TO RELATED APPLICATION(S)

This application claims priority to Korean Patent Application No. 10-2019-0047872, filed on Apr. 24, 2019, and all the benefits accruing therefrom under 35 U.S.C. § 119, the content of which in its entirety is herein incorporated by reference.

BACKGROUND

Field

The disclosure relates to a display device.

Description of the Related Art

In general, a display device may include a display area for displaying images and a non-display area surrounding sides of the display area.

In recent years, as interest in information display and demand for use of a portable information medium increases, demand and commercialization of display devices have increased and developed. Also, complying with demand of increasing a display area, there has been a desire for reducing a non-display area of display devices.

SUMMARY

In varying embodiments, provided is a display device that can be manufactured and better prevent static electricity from flowing from outside of the display device by disposing a bottom metal layer on an electrostatic discharge portion to increase a capacitance of a capacitor included in the electrostatic discharge portion. A dead space in a display device may be reduced by reducing or minimizing an area of the electrostatic discharge portion.

In an embodiment, a display device may include a substrate including a display area and a non-display area, at least one pixel provided in the display area, each of the at least one pixel including at least one pixel transistor and a light emitting element connected to the pixel transistor, a first driver provided in the non-display area and configured to provide a scan signal to the at least one pixel, a scan line configured to transfer the scan signal to the at least one pixel, a first fan-out line provided in the non-display area and connected to the scan line, and a first electrostatic discharge portion provided in the non-display area and located in and area between the first fan-out line and the scan line. Here, the first electrostatic discharge portion may include a bottom metal layer disposed on the substrate, and a transistor disposed on the bottom metal layer and electrically connected to the bottom metal layer.

In an embodiment, the transistor of the first electrostatic discharge portion may include an active pattern disposed on a buffer layer on the substrate, a gate electrode disposed on the active pattern, and a source electrode and a drain electrode respectively connected to side portions of a central region overlapping the gate electrode in the active pattern.

In an embodiment, the bottom metal layer may include a first bottom metal layer and a second bottom metal layer between the substrate and the buffer layer. The first bottom metal layer and the second bottom metal layer may be spaced apart from each other.

In an embodiment, the first electrostatic discharge portion may include a first lower electrode disposed on the first bottom metal layer, a first upper electrode disposed on the first lower electrode, a second lower electrode disposed on the second bottom metal layer, and a second upper electrode disposed on the second lower electrode.

In an embodiment, the first lower electrode and the first upper electrode may form a first capacitor with at least one interlayer insulating layer disposed between the first lower electrode and the first upper electrode, and the second lower electrode and the second upper electrode may form a second capacitor with the at least one interlayer insulating layer disposed between the second lower electrode and the second upper electrode.

In an embodiment, the first bottom metal layer and the first lower electrode may form a first additional capacitor with at least one insulating layer positioned under the at least one interlayer insulating layer which may be disposed between the first bottom metal layer and the first lower electrode, and the second bottom metal layer and the second lower electrode may form a second additional capacitor with the at least one insulating layer which may be disposed between the second bottom metal layer and the second lower electrode.

In an embodiment, the first lower electrode and the second lower electrode may be integral with the gate electrode.

In an embodiment, the gate electrode, the first lower electrode, and the second lower electrode may be located in a same layer as the scan line.

In an embodiment, the first upper electrode may overlap the first bottom metal layer, and the second upper electrode may overlap the second bottom metal layer in a plan view.

In an embodiment, each of the first and second upper electrodes may overlap a part of the gate electrode in a plan view.

In an embodiment, each of the first and second bottom metal layers may overlap a part of the gate electrode in a plan view.

In an embodiment, a display device may include a power line located in the non-display area and configured to provide driving power to the at least one pixel. The first electrostatic discharge portion may be electrically connected with the first fan-out line and the power line.

In an embodiment, the first fan-out line may be integral with the first upper electrode and may be electrically connected to the first bottom metal layer, and the power line may be integral with the second upper electrode and may be electrically connected to the second bottom metal layer.

In an embodiment, the first electrostatic discharge portion may include a first connection wiring electrically connecting the first bottom metal layer and the first fan-out line.

In an embodiment, the first connection wiring may be located in the a layer as the first and second lower electrodes.

In an embodiment, the display device may include a second driver located in the non-display area and configured to provide a data signal to the at least one pixel, a data line configured to transfer the data signal to the at least one pixel, a second fan-out line located in the non-display area and connected to the data line, and a second electrostatic discharge portion provided in the non-display area and located in an area between the second fan-out line and the data line.

In an embodiment, the first upper electrode and the second upper electrode may be located in a same layer as the data line.

In an embodiment, the second electrostatic discharge portion may include a same structure as the first electrostatic discharge portion.

In an embodiment, the first electrostatic discharge portion may include a lower electrode disposed on the bottom metal layer, and an upper electrode disposed on the lower electrode.

In an embodiment, the lower electrode and the upper electrode may form a capacitor with at least one interlayer insulating layer disposed between the lower electrode and the upper electrode.

In an embodiment, the bottom metal layer and the lower electrode may form an additional capacitor with at least one insulating layer positioned under the at least one interlayer insulating layer which is disposed between the bottom metal layer and the lower electrode.

In an embodiment, the gate electrode may be integral with the first fan-out line, and the lower electrode may be located apart from the gate electrode.

In an embodiment, the first electrostatic discharge portion may include a first connection wiring electrically connecting one of the source electrode and the drain electrode with the lower electrode, and a second connection wiring electrically connecting the other one of the source electrode and the drain electrode with the lower electrode.

In an embodiment, the at least one pixel transistor may include a pixel active pattern disposed on the buffer layer, a pixel gate electrode disposed on the pixel active pattern, and a first terminal and a second terminal respectively connected to side portions of a center region overlapping the pixel gate electrode in the pixel active pattern.

In an embodiment, the at least one pixel may include a lower electrode integral with the pixel gate electrode, and an upper electrode disposed on the lower electrode. The lower electrode and the upper electrode may form a storage capacitor with at least one interlayer insulating layer which is disposed between the lower electrode and the upper electrode.

In an embodiment, the at least one pixel may include a conductive pattern overlapping the pixel gate electrode. The conductive pattern may be located in a same layer as the bottom metal layer.

In an embodiment, the at least one pixel may include a second connection wiring disposed on the upper electrode and electrically connected to the upper electrode, and a bridge pattern disposed on the second connection wiring and electrically connected to the second connection wiring.

In an embodiment, the light emitting element may include an anode electrode disposed on the bridge pattern and electrically connected to the bridge pattern, a light emitting layer disposed on the anode electrode, and a cathode electrode disposed on the light emitting layer.

In another embodiment, a display device may include a substrate including a display area and a non-display area, at least one pixel provided in the display area and each of the at least one pixel including at least one pixel transistor and a light emitting element connected to the at least one pixel transistor, a first driver provided in the non-display area and configured to provide a scan signal to the at least one pixel, a second driver provided in the non-display area and configured to provide a data signal to the at least one pixel, a scan line configured to transfer the scan signal to the at least one pixel, a data line configured to transfer the data signal to the at least one pixel, a first fan-out line provided in the non-display area and connected to the scan line, a second fan-out line provided in the non-display area and connected to the data line, a first electrostatic discharge portion provided in the non-display area and located in an area between the first fan-out line and the scan line, and a second electrostatic discharge portion provided in the non-display area and located in an area between the second fan-out line and the data line. Each of the first and second electrostatic discharge portions may include a bottom metal layer disposed on the substrate, and a transistor disposed on the bottom metal layer and electrically connected to the bottom metal layer.

In the varying embodiments, a non-display area of a display device may be reduced by reducing or minimizing an area of an electrostatic discharge circuit. The display device may block a static electricity inflow to a display area.

The effects and advantages of the various examples of the disclosure are not limited by the contents exemplified above, and more various effects and advantages are apparent to the of ordinary skill in the specification below.

BRIEF DESCRIPTION OF THE DRAWINGS

The above and other features of the invention will become more apparent by describing in further detail examples thereof with reference to the accompanying drawings, in which.

DETAILED DESCRIPTION OF THE EMBODIMENTS

Figure 1:
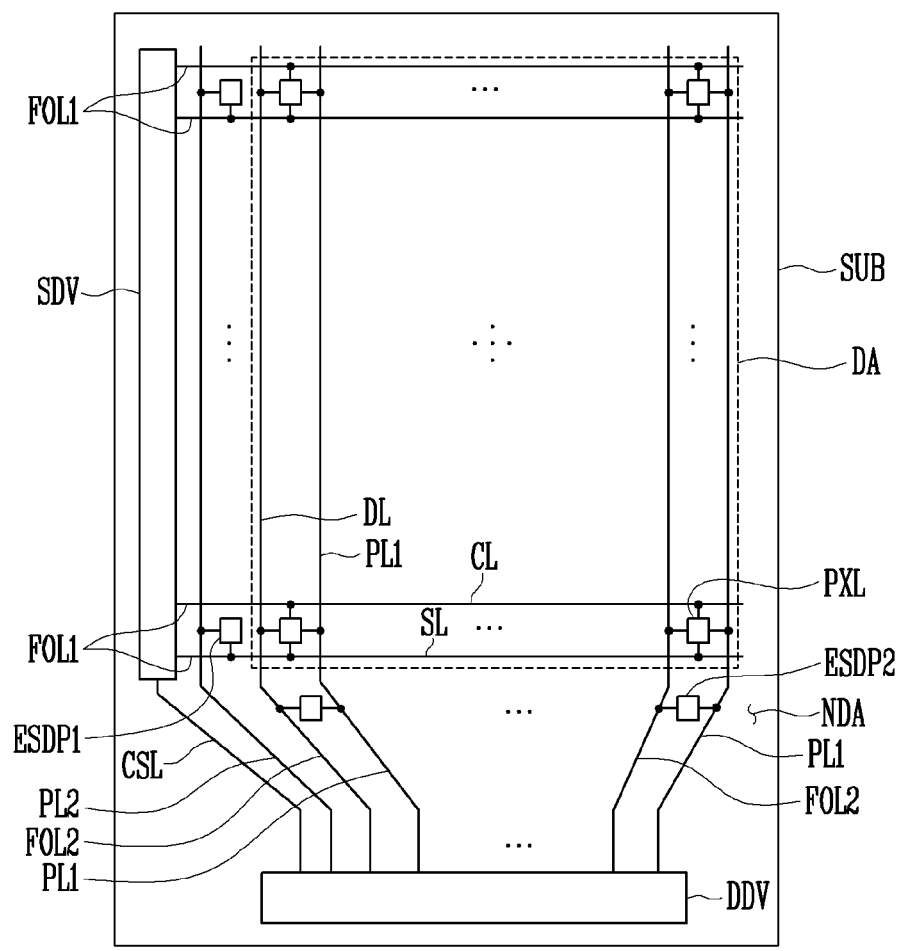
FIG. 1 is a plan view schematically illustrating a display device with pixels according to an embodiment.

Specific examples are illustrated in the drawings and described in detail in the specification. However, the disclosed systems and devices can be modified in various manners and take various forms different from the detailed drawings but consistent with the disclosure. Thus, it should be understood that the disclosure is not intended to be limited to the disclosed particular forms. Further, it should be understood that the disclosure is intended to cover all modifications, equivalents, and substitutions within the spirit and technical range of the disclosure.

Similar reference numerals are used for similar elements in describing each drawing. In the accompanying drawings, the dimensions of the structures are shown enlarged from the actual dimensions for the sake of clarity of the disclosure. The terms first, second, etc. may be used to describe various elements, but the element should not be limited by the terms. The terms are used only for the purpose of distinguishing one element from another element. For example, without departing from the scope of the disclosure, a first element may be referred to as a second element, and similarly, a second element may also be referred to as a first element. The singular expressions include plural expressions unless the context clearly indicates otherwise.

It should be understood that in the description, the terms "include", "have", or the like are used to specify that there is a feature, a number, a step, an operation, an element, a part, or a combination thereof described in the specification, but do not exclude a possibility of the presence or addition of one or more other features, numbers, steps, operations, elements, parts, or combinations thereof in advance. In addition, a case where a portion of a layer, a film, a region, a plate, or the like is referred to as being "on" another portion, it includes not only a case where the portion is "directly on" another portion, but also a case where there is further another portion between the portion and another portion. In addition, in the description, when a portion of a layer, a film, a region, a plate, or the like is formed on another portion, a forming direction is not limited to an upper direction but includes forming the portion on a side surface or in a lower direction. On the contrary, when a portion of a layer, a film, a region, a plate, or the like is formed "under" another portion, this includes not only a case where the portion is "directly beneath" another portion but also a case where there is further another portion between the portion and another portion.

Further, in the description, the phrase "in a plan view" refers to when an object portion is viewed from above, and the phrase "in a cross-sectional view" refers to when a cross-section taken by vertically cutting an object portion is viewed from the side.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

Further, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, further to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the description, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this description.

Further, the terms "about" or "approximately" as used herein are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 80%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

Hereinafter, various examples of the disclosure and others necessary for those skilled in the art to understand the disclosure will be described in detail with reference to the accompanying drawings.

FIG. 1 is a plan view schematically illustrating a display device according to an embodiment.

The display device may include a substrate SUB, pixels PXL provided on the substrate SUB, a driver provided on the substrate SUB that drives the pixels PXL, and a wiring portion connecting the pixels PXL and the driver with each other.

The substrate SUB may include a display area DA and a non-display area NDA.

The display area DA may be disposed in a central area of the display device, and the non-display area NDA may be disposed in an edge area of the display device so as to surround the display area DA. However, the positions of the display area DA and the non-display area NDA are not limited thereto, and positions thereof may be changed.

The display area DA may be an area where the pixels PXL for displaying an image or images are provided. The non-display area NDA may be an area where the driver for driving the pixels PXL and a part of the wiring portion for connecting the pixels PXL and the driver with each other are provided.

The display area DA may have various shapes. For example, the display area DA may be provided in various shapes such as a closed polygon including sides formed of straight lines, a circle and an ellipse including a side formed of a curved line, and a semicircle and a semi-ellipse including a side formed of a straight line and a curved line.

The non-display area NDA may be provided on at least one side of the display area DA. The non-display area NDA may surround a periphery of the display area DA.

The substrate SUB may be formed of a transparent insulating material and may transmit light.

The substrate SUB may be a rigid substrate. For example, the substrate SUB may be one of a glass substrate, a quartz substrate, a glass ceramic substrate, and a crystalline glass substrate.

The substrate SUB may be a flexible substrate. Here, the substrate SUB may be one of a film substrate and a plastic substrate including a polymer organic substance. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material configuring the substrate SUB may be variously changed, and may include fiber reinforced plastic (FRP) or any other known or later developed material suitable for the purposes of this disclosure.

An area on the substrate SUB may be provided as the display area DA where the pixels PXL are disposed. The remaining area may be provided as the non-display area NDA. The display area DA may include pixel areas in which the pixels PXL is disposed. The non-display area NDA may be disposed in the periphery of the display area DA.

Each of the pixels PXL may be provided in the display area DA on the substrate SUB. In an embodiment, the pixels PXL may be provided and may be arranged in a matrix form along a pixel row extending in a first direction DR1 and a pixel column extending in a second direction DR2. However, an arrangement form of the pixels PXL is not limited thereto. For example, the pixels PXL may be arranged in the display area DA in various arrangement structures.

Each of the pixels PXL may include a light emitting element (referring to FIG. 2) for emitting white light and/or color light, and a pixel circuit (referring to FIG. 2) for driving the light emitting element. The pixel circuit may include at least one or more pixel transistors connected to the light emitting element.

Each pixel PXL may emit any one of red, green, and blue colors, as nonlimiting examples. For instance, a pixel PXL may emit one of cyan, magenta, yellow and white, or a collection of pixels PXL may together emit cyan, magenta, yellow, and white.

The driver may include a scan driver SDV, a data driver DDV, and a timing controller (not shown).

The scan driver SDV may generate scan signals and sequentially output the scan signals to scan lines SL. The scan driver SDV may include at least one transistor formed through the same process that forms the pixel circuit of the pixels PXL. Such processes may include, for example, a low temperature polycrystalline silicon (LTPS) process or a low temperature polycrystalline oxide (LTPO) process. The scan driver SDV may be provided in a chip on glass type in the non-display area NDA of the substrate SUB as a separate chip, or may be mounted on a printed circuit board to be connected to the substrate SUB through a connection member.

The scan driver SDV may further output another control signal, a clock signal, and the like to the pixel circuit of the pixels PXL. For example, the scan driver SDV may generate control signals and sequentially output the control signals to control lines CL.

The data driver DDV may be disposed in the non-display area NDA and may output the data signals to data lines DL. The data signals provided to the data lines DL may be provided to the pixels PXL selected by the scan signal.

The scan driver SDV and the data driver DDV may be disposed in the non-display area NDA of the substrate SUB. Positions of the scan driver SDV and/or the data driver DDV may not be limited thereto but may be changed as varying positions are necessitated.

The driver may further include a driver other than the scan driver SDV and the data driver DDV described above.

The wiring portion may include the scan lines SL, the data lines DL, the control lines CL, a control signal line CSL, a power line PL, and a fan-out line FOL.

Each of the scan lines SL may be connected to a corresponding pixel PXL among the pixels PXL. Each of the data lines DL may be connected to a corresponding pixel PXL among the pixels PXL. Each of the control signal lines CL may be arranged in parallel to a corresponding scan line SL among the scan lines SL. The control signal lines CSL may transfer the scan control signals to the scan driver SDV.

The power line PL may include first power lines PL1 and a second power line PL2. Each of the first power lines PL1 may be connected to a corresponding pixel PXL among the pixels PXL. The second power line PL2 may be provided in the non-display area NDA and may be connected to a first electrostatic discharge portion ESDP1. A driving power of a common level may be applied to each of the first power lines PL1 and the second power line PL2.

The fan-out line FOL may be provided in the non-display area NDA and may include first fan-out lines FOL1 and second fan-out lines FOL2.

The first fan-out lines FOL1 may be connected between the scan driver SDV and the scan lines SL and may transfer the scan signals generated in the scan driver SDV to the scan lines SL. The second fan-out lines FOL2 may be connected between the data driver DDV and the data lines DL and may transfer the data signals generated in the data driver DDV to the data lines DL.

In recent models of display devices displaying high quality images, intervals between circuits and wirings disposed in the display device may become narrower so that a possibility of occurrence of static electricity may increase. When static electricity is generated, a pixel circuit may be malfunction or a problem may occur in a configuration of the pixel circuit. To solve this, a circuit for preventing static electricity may be provided on the scan lines SL and/or the data lines DL or each of them.

In an embodiment, the display device may include an electrostatic discharge portion ESDP for preventing static electricity.

The electrostatic discharge portion ESDP may be provided in the non-display area NDA and may include one or more first electrostatic discharge portions ESPD1 and one or more second electrostatic discharge portions ESDP2.

Each of the first electrostatic discharge portions ESDP1 may be located in an area between each of the first fan-out lines FOL1 and one scan line SL corresponding to each of the first fan-out lines FOL1. Each of the first electrostatic discharge portions ESDP1 may be electrically connected to the second power line PL2. Each of the first electrostatic discharge portions ESDP1 may electrically connect the second power line PL2 and one scan line SL to prevent static electricity generated in the one scan line SL.

Each of the second electrostatic discharge portion ESDP2 may be located in an area between each of the second fan-out lines FOL2 and one data line DL corresponding to each second fan-out line FOL2. Each of the second electrostatic discharge portions ESDP2 may be electrically connected to the first power line PL1. Each of the second electrostatic discharge portions ESDP2 may electrically connect the first power line PL1 and one data line DL to prevent static electricity generated in the one data line DL.

Configurations of the first and second electrostatic discharge portions ESDP1 and ESDP2 will be further described with reference to FIGS. 5A, 5B, and 6.

Figure 2:
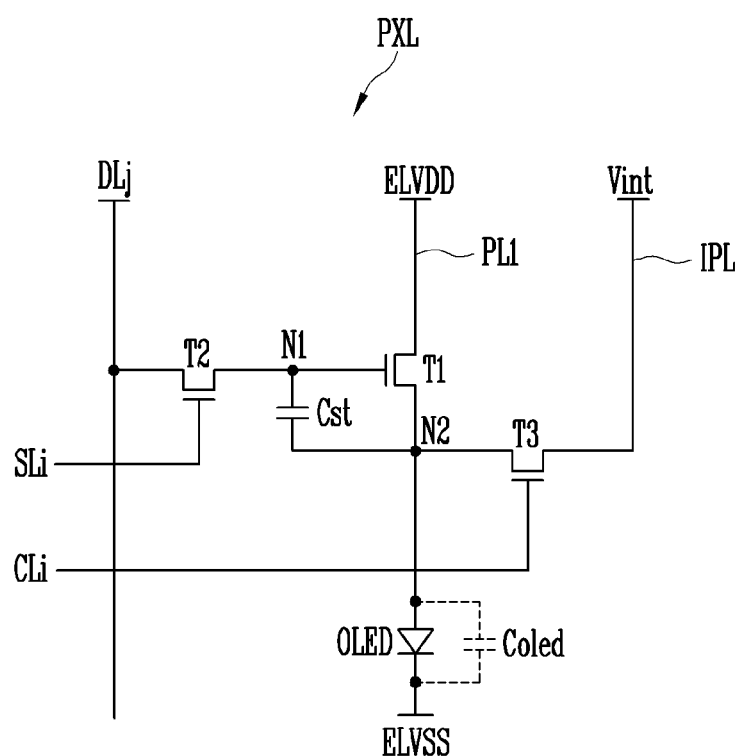
FIG. 2 is an equivalent circuit diagram illustrating one pixel among the pixels shown in FIG. 1.

FIG. 2 is an equivalent circuit diagram illustrating a pixel among the pixels shown in FIG. 1.

In FIG. 2, a pixel PXL connected to a j-th data line, an i-th scan line, and an i-th control line is shown as an example. Referring to FIGS. 1 and 2, the pixel PXL may include a light emitting element OLED, the j-th data line DLj, the i-th scan line SLi, a first power line PL1, and the i-th control line CLi. The pixel PXL may include a pixel circuit connected to the j-th data line DLj, the i-th scan line SLi, the i-th control line CLi, and the first power line PL1.

An anode electrode of the light emitting element OLED may be connected to the pixel circuit, and a cathode electrode of the light emitting element OLED may be connected to a second driving power ELVSS. The light emitting element OLED may generate light having a predetermined luminance corresponding to an amount of current provided from the pixel circuit. First driving power ELVDD applied to the first power line PL1 may be set to a voltage higher than the second driving power ELVSS so that the current flows to the light emitting element OLED. A potential difference between the first driving power ELVDD and the second driving power ELVSS may be set to be equal to or greater than a threshold voltage of the light emitting element OLED during a light emitting period of the pixel PXL.

The pixel circuit may control an amount of current flowing from the first driving power ELVDD to the second driving power ELVSS through the light emitting element OLED in response to the data signal during a driving period. The pixel circuit may provide current information of the light emitting element OLED to a compensator (not shown) during a sensing period. To this end, the pixel circuit may include first to third pixel transistors T1 to T3, a storage capacitor Cst, and an auxiliary capacitor Coled.

The first pixel transistor (or a driving transistor) T1 may be connected between the first driving power ELVDD and the second driving power ELVSS together with the light emitting element OLED and may provide the current for driving the light emitting element OLED to the light emitting element OLED. One electrode of the first pixel transistor T1, for example, a source electrode of the first pixel transistor T1 may be connected to the anode electrode of the light emitting element OLED, and the other electrode, for example, a drain electrode may be connected to the first power line PL1 to which the first driving power ELVDD is applied. A gate electrode of the first pixel transistor T1 may be connected to a first node N1. The first transistor T1 may control the amount of current flowing from the first driving power ELVDD to the second driving power ELVSS through the light emitting element OLED in response to a voltage of the first node N1.

The second pixel transistor (or a switching transistor) T2 may be connected between the j-th data line DLj and the first node N1. A gate electrode of the second pixel transistor T2 may be connected to the i-th scan line SLi that is connected to the pixel PXL. The second pixel transistor T2 may be turned on when a scan signal of a gate-on voltage (for example, a high voltage) is provided to the i-th scan line SLi to electrically connect the j-th data line DLj and the first node N1 with each other. Therefore, when the second pixel transistor T2 is turned on, the data signal provided to the j-th data line DLj may be transferred to the first node N1.

The third pixel transistor T3 may be connected between an initial power line IPL to which an initialization power Vint is applied and the second node N2. The third pixel transistor T3 may be turned on when a control signal is provided to the i-th control line CLi during an initialization period to electrically connect the initialization power line IPL and the second node N2 with each other. The control signal may have a voltage (for example, a high voltage) capable of turning the third pixel transistor T3 on. Therefore, when the third pixel transistor T3 is turned on, the initialization power Vint applied to the initialization power line IPL may be transferred to the second node N2. The initialization power Vint may have a voltage, for example, less than the lowest voltage of the data signal.

The third pixel transistor T3 may be turned on when the control signal is provided to the i-th control line CLi during the sensing period. When the third pixel transistor T3 is turned on during the sensing period, a reference voltage from the compensator (not shown) may be provided to the anode electrode of the light emitting element OLED. A predetermined current corresponding to the reference voltage may flow through the light emitting element OLED, and the predetermined current may be provided to the compensator as deterioration information.

The first to third pixel transistors T1 to T3 included in the pixel circuit are all implemented as N-type thin film transistors, but the embodiment are not limited thereto. In other examples, the first to third pixel transistors T1 to T3 included in the pixel circuit may be implemented as P-type thin film transistors.

The storage capacitor Cst may be connected between the first node N1 and the second node N2 and may store the data signal provided to the first node N1 and a voltage corresponding to the threshold voltage of the first pixel transistor T1.

The auxiliary capacitor Coled may be connected to utilize a coupling effect with the storage capacitor Cst in consideration of a capacitance of a parasitic capacitor generated by the anode electrode and the cathode electrode of the light emitting element OLED.

Figure 3:
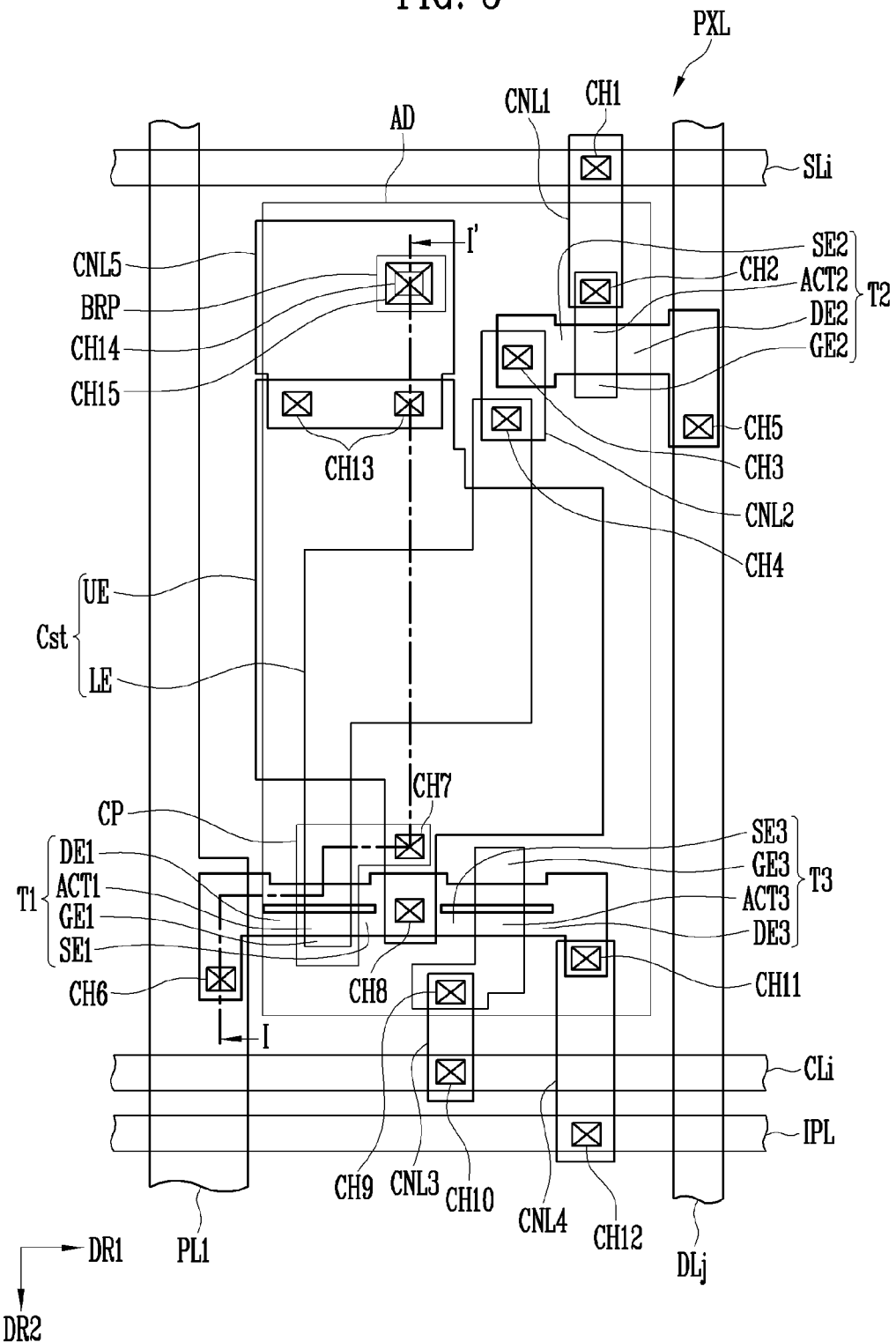
FIG. 3 is a plan view illustrating one pixel among the pixels shown in FIG. 1 in detail.
Figure 4:
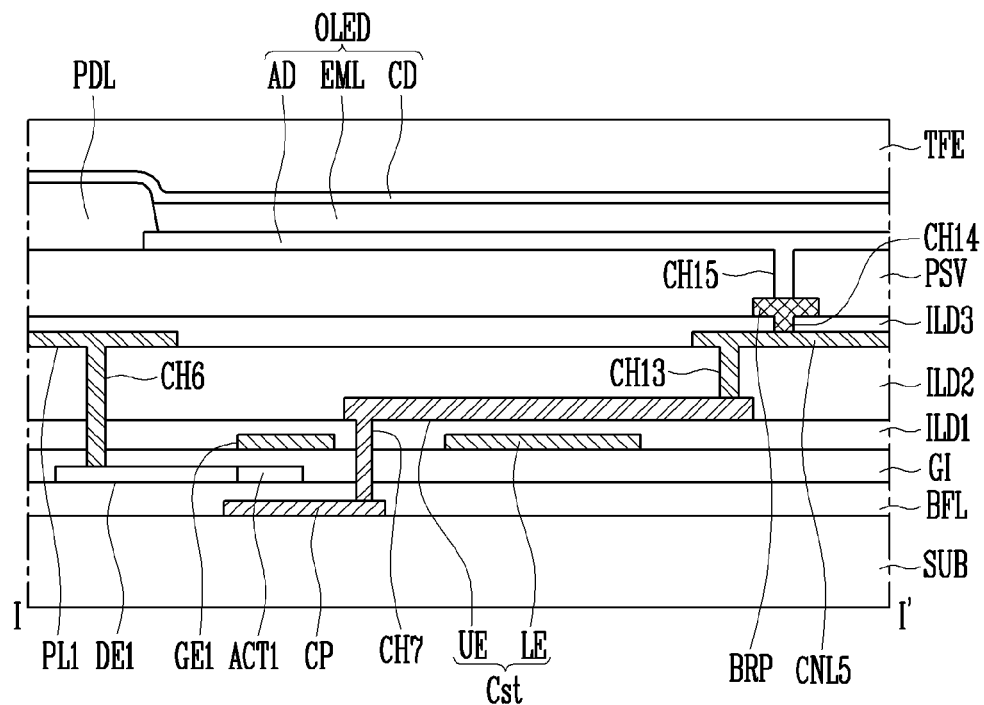
FIG. 4 is a cross-sectional view taken along line I~I' of FIG. 3.

FIG. 3 is a plan view illustrating one pixel PXL among the pixels PXL shown in FIG. 1 in detail, and FIG. 4 is a cross-sectional view taken along line I~I' of FIG. 3.

As shown in FIG. 3, a pixel PLX may be disposed in an i-th row and a j-th column in the display area. The scan line SLi of the i-th row, the control line CLi of the i-th row, the data line DLj of the j-th column, the first power line PL1 of the j-th column, and the initialization power line IPL of the j-th column may be arranged with the pixel PLX and the elements thereof.

In FIGS. 3 and 4, for convenience of description, the scan line of the i-th row is referred to as a "scan line SLi", the control line of the i-th row is referred to as a "control line CLi", the data line of the j-th column is referred to as a "data line DLj", the first power line of the j-th column is referred to as a "first power line PL1", and the initialization power line IPL of the i-th row is referred to as an "initialization power line IPL."

FIGS. 3 and 4 illustrate a structure of one pixel PXL by simplifying the structure of one pixel PXL such as illustrating each electrode as a single electrode layer and each insulating layer as a single insulating layer. However, FIGS. 3 and 4 represent a nonlimiting example, and the disclosure is not limited thereto.

Referring to FIGS. 1 to 4, as mentioned above the display device may include the substrate SUB, the pixel PXL provided on the substrate SUB, and the wiring portion connected to the pixel PXL. The wiring portion may provide a signal to the pixel PXL and include the scan line SLi, the control line CLi, the data line DLj, the first power line PL1, and the initialization power line IPL.

The scan line SLi may extend in the first direction DR1 on the substrate SUB and may be provided to the pixel PXL. The scan line SLi may be provided and/or formed on a gate insulating layer GI. The gate insulating layer GI may be an inorganic insulating film including an inorganic material. An i-th scan signal generated by the scan driver SDV may be provided to the scan line SLi through the corresponding first fan-out line FOL1.

The control line CLi may extend in the first direction DR1 and may be disposed to be spaced apart from the scan line SLi in a plan view. The control signal may be applied to the control line CLi. The control line CLi may be disposed in the same layer as the scan line SLi and may include the same material as the scan line SLi. In the description, "provided and/or formed in the same layer" may mean being formed in the same process.

The initialization power line IPL may extend in the first direction DR1 and may be disposed to be spaced apart from the control line CLi in a plan view. The initialization power Vint may be applied to the initialization power line IPL. The initialization power line IPL may be disposed in the same layer as the scan line SLi and the control line CLi, and may include the same material as the scan line SLi and the control line CLi. The initialization power line IPL may be provided and/or formed on the gate insulating layer GI. However, the disclosure is not limited thereto. The initialization power line IPL may be provided on a first interlayer insulating layer ILD1 between the data line DLj and the scan line SLi. Here, the first interlayer insulating layer ILD1 may be an inorganic insulating film including an inorganic material or an organic insulating film including an organic material.

The data line DLj may extend in the second direction DR2. The data signal generated in the data driver DDV may be provided to the data line DLi through the corresponding second fan-out line FOL2. The data line DLj may be provided and/or formed on a second interlayer insulating layer ILD2. The second interlayer insulating layer ILD2 may be an inorganic insulating film including an inorganic material or an organic insulating film including an organic material.

The first power line PL1 may extend in the second direction DR2 and may be disposed to be spaced apart from the data line DLj. The first driving power ELVDD may be applied to the first power line PL1. The first power line PL1 may be disposed in the same layer as the data line DLj and may include the same material as the data line DLj. The first power line PL1 may be provided and/or formed on the second interlayer insulating layer ILD2.

The pixel PXL may include the first to third pixel transistors T1 to T3, the storage capacitor Cst, the light emitting element OLED, first to fifth connection wirings CNL1 to CNL5, and a bridge pattern BRP.

The first pixel transistor T1 may include a first gate electrode GE1, a first active pattern ACT1, a first source electrode SE1, and a first drain electrode DE1.

The first gate electrode GE1 may be connected to a second source electrode SE2 of the second pixel transistor T2. The second connection wiring CNL2 connects the second source electrode SE2 and the first gate electrode GE1 with each other. The first gate electrode GE1 may extend along the second direction DR2 in a plan view and may be provided integrally with a lower electrode LE of the storage capacitor Cst described later. When the lower electrode LE is provided integrally with the first gate electrode GE1, the lower electrode LE may be one region of the first gate electrode GE1.

One end of the second connection wiring CNL2 may be connected to the second source electrode SE2 through a third contact hole CH3 passing through the first interlayer insulating layer ILD1 and the gate insulating layer GI, and the other end of the second connection wiring CNL2 may be connected to the first gate electrode GE1 through a fourth contact hole CH4 passing through the first interlayer insulating layer ILD1.

In an embodiment, the first active pattern ACT1, the first source electrode SE1, and the first drain electrode DE1 may be formed of a semiconductor layer that is not doped with an impurity or doped with the impurity. The first source electrode SE1 and the first drain electrode DE1 may be formed of a semiconductor layer doped with an impurity and the first active pattern ACT1 may be formed of a semiconductor layer that is not doped with the impurity.

The first active pattern ACT1 may overlap the first gate electrode GE1 in a plan view.

One end of the first source electrode SE1 may be connected to the first active pattern ACT1 and the other end of the first source electrode SE1 may be electrically connected to the upper electrode UE of the storage capacitor Cst through an eighth contact hole CH8 sequentially passing through the gate insulating layer GI and the first interlayer insulating layer ILD1.

One end of the first drain electrode DE1 may be connected to the first active pattern ACT1 and the other end of the first drain electrode DE1 may be connected to the first power line PL1 through a sixth contact hole CH6 sequentially passing through the gate insulating layer GI and the first and second interlayer insulating layers ILD1 and ILD2.

As shown in the drawing, the first pixel transistor T1 may be provided as transistors to prevent a leakage current, but is not limited thereto. The first pixel transistor T1 may be provided as one transistor.

The second pixel transistor T2 may include a second gate electrode GE2, a second active pattern ACT2, the second source electrode SE2, and a second drain electrode DE2.

The second gate electrode GE2 may be electrically connected to the scan line SLi. The first connection wiring CNL1 may connect the second gate electrode GE2 and the scan line SLi. The second gate electrode GE2 may be provided separately from the scan line SLi and may be provided independently from the scan line SLi, but the disclosure is not limited thereto. The second gate electrode GE2 may be provided as a part of the scan line SLi or may be provided in a shape protruding in one direction from the scan line SLi.

One end of the first connection wiring CNL1 may be connected to the scan line SLi through a first contact hole CH1 sequentially passing through the first and second interlayer insulating layers ILD1 and ILD2, and the other end of the first connection wiring CNL1 may be connected to the second gate electrode GE2 through a second contact hole CH2 sequentially passing through the first and second interlayer insulating layers ILD1 and ILD2.

In an embodiment, the second active pattern ACT2, the second source electrode SE2, and the second drain electrode DE2 may be formed of a semiconductor layer that is not doped with an impurity or doped with the impurity. The second source electrode SE2 and the second drain electrode DE2 may be formed of a semiconductor layer doped with the impurity and the second active pattern ACT2 may be formed of a semiconductor layer that is not doped with the impurity. The second active pattern ACT2 may overlap the second gate electrode GE2 in a plan view.

One end of the second source electrode SE2 may be connected to the second active pattern ACT2 and the other end of the second source electrode SE2 may be electrically connected to the second connection wiring CNL2 through the third contact hole CH3. As described above, as the second connection wiring CNL2 may be electrically connected to the first gate electrode GE1 through the fourth contact hole CH4, the second source electrode SE2 may be finally connected to the first gate electrode GE1.

One end of the second drain electrode DE2 may be connected to the second active pattern ACT2 and the other end of the second drain electrode DE2 may be connected to the data line DLj through a fifth contact hole CH5 sequentially passing through the gate insulating layer GI and the first and second interlayer insulating layers ILD1 and ILD2.

The third pixel transistor T3 may include a third gate electrode GE3, a third active pattern ACT3, a third source electrode SE3, and a third drain electrode DE3.

The third gate electrode GE3 may be electrically connected to the control line CLi. The third connection wiring CNL3 may connect the third gate electrode GE3 and the control line CLi with each other. The third gate electrode GE3 may be disposed apart from the control line CLi and provided independently from the control line CLi, but the disclosure is not limited thereto. The third gate electrode GE3 may be provided as a part of the control line CLi or may be provided in a shape protruding from the control line CLi.

One end of the third connection wiring CNL3 may be electrically connected to the third gate electrode GE3 through a ninth contact hole CH9 sequentially passing through the first and second interlayer insulating layers ILD1 and ILD2. The other end of the third connection wiring CNL3 may be electrically connected to the control line CLi through a tenth contact hole CH10 sequentially passing through the first and second interlayer insulating layers ILD1 and ILD2.

In an embodiment, the third active pattern ACT3, the third source electrode SE3, and the third drain electrode DE3 may be formed of a semiconductor layer that is not doped with an impurity or doped with the impurity. The third source electrode SE3 and the third drain electrode DE3 may be formed of a semiconductor layer doped with an impurity and the third active pattern ACT3 may be formed of a semiconductor layer that is not doped with the impurity.

The third active pattern ACT3 may overlap the third gate electrode GE3 in a plan view.

One end of the third source electrode SE3 may be connected to the third active pattern ACT3. The other end of the third source electrode SE3 may be electrically connected to the first source electrode SE1 and may be electrically connected to the upper electrode UE through the eighth contact hole CH8.

One end of the third drain electrode DE3 may be connected to the third active pattern ACT3. The other end of the third drain electrode DE3 may be electrically connected to the fourth connection wiring CNL4 through an eleventh contact hole CH11 sequentially passing through the gate insulating layer GI and the first and second interlayer insulating layers ILD1 and IDL2.

One end of the fourth connection wiring CNL4 may be connected to the third drain electrode DE3 through the eleventh contact hole CH11 and the other end of the fourth connection wiring CNL4 may be connected to the initialization power line IPL through a twelfth contact hole CH12 sequentially passing through the first and second interlayer insulating layers ILD1 and ILD2. As described above, as the fourth connection wiring CNL4 may be electrically connected to the initialization power line IPL through the twelfth contact hole CH12, the third drain electrode DE3 may be finally electrically connected to the initialization power line IPL.

The third pixel transistor T3 may be provided as transistors in order to prevent a leakage current, but its embodiment is not limited thereto. In other various examples, the third pixel transistor T3 may be provided as one transistor similarly to the second pixel transistor T2.

The storage capacitor Cst may include the lower electrode LE and the upper electrode UE. The lower electrode LE may be provided integrally with the first gate electrode GE1 of the first pixel transistor T1. When the lower electrode LE may be provided integrally with the first gate electrode GE1, the lower electrode LE may be one region of the first gate electrode GE1.

The upper electrode UE may overlap the lower electrode LE and may cover the lower electrode LE in a plan view. The capacitance of the storage capacitor Cst may be increased by increasing an overlapping area of the upper electrode UE and the lower electrode LE.

The upper electrode UE may be electrically connected to the third source electrode SE3 of the third pixel transistor T3 and the first source electrode SE1 of the first pixel transistor T1 through the eighth contact hole CH8. The upper electrode UE may be electrically connected to the fifth connection wiring CNL5 through a thirteenth contact hole CH13 passing through the second interlayer insulating layer ILD2.

One end of the fifth connection interconnection CNL5 may be electrically connected to the upper electrode UE through the thirteenth contact hole CH13 and the other end of the fifth connection interconnection CNL5 may be electrically connected to the bridge pattern BRP through a fourteenth contact hole CH14 passing through a third interlayer insulating layer ILD3.

One end of the bridge pattern BRP may be electrically connected to the fifth connection wiring CNL5 through the fourteenth contact hole CH14 and the other end of the bridge pattern BRP may be electrically connected to the anode electrode AD of the light emitting element OLED through a fifteenth contact hole CH15 passing through a protection layer PSV.

The bridge pattern BRP may be an intermediate medium for electrically connecting the fifth connection wiring CNL5 and the anode electrode AD with each other. However, in various examples, the bridge pattern BRP may be omitted according to a material and a process condition of the fifth connection wiring CNL5. For example, when the fifth connection wiring CNL5 is formed of copper and one region of the fifth connection wiring CNL5 is exposed to the outside, the bridge pattern BRP may be electrically connected to the anode electrode AD while preventing the fifth connection wiring CNL5 from being corroded by covering the fifth connection wiring CNL5. The bridge pattern BRP may be formed of a conductive material having a resistance to corrosion.

The anode electrode AD may be formed and/or provided on the protection layer PSV. The anode electrode AD may be electrically connected to the bridge pattern BRP through the fifteenth contact hole CH15. As described above, since the bridge pattern BRP is electrically connected to the fifth connection wiring CNL5, the fifth connection wiring CNL5 is electrically connected to the upper electrode UE, and the upper electrode UE is connected to each of the first source electrode SE1 of the first pixel transistor T1 and the third source electrode SE3 of the third pixel transistor T3, the anode electrode AD may be finally connected to the first source electrode SE1 of the first pixel transistor T1 and the third source electrode SE3 of the third pixel transistor T3.

On the substrate SUB including the anode electrode AD, a pixel definition layer PDL for dividing (or defining) a light emitting region of the pixel PXL may be provided. The pixel definition layer PDL may include an opening exposing a part of an upper surface of the anode electrode AD and may protrude from the substrate SUB along a periphery of the pixel PXL. The pixel definition layer PDL may be an organic insulating film including an organic material.

A light emitting layer EML may be provided and/or formed on the upper surface of the anode electrode AD exposed by an opening of the pixel definition layer PDL. On the light emitting layer EML, the cathode electrode CD may be provided and/or formed. The light emitting layer EML may be disposed on the exposed anode electrode AD. The light emitting layer EML may have a multilayer thin film structure including at least a light generation layer. For example, the light emitting layer EML may have the multilayer thin film structure including a hole injection layer for injecting holes, a hole transport layer for increasing a hole recombination opportunity by suppressing movement of electrons that are excellent in transportability of holes and are not combined in a light generation layer, a light generation layer for emitting light by recombination of the injected electrons and holes, a hole blocking layer for suppressing the movement of the holes that are not combined in the light generation layer, an electron transport layer for smoothly transporting the electrons to the light generation layer, and an electron injection layer for injecting the electrons. The hole injection layer, the hole transport layer, the hole blocking layer, the electron transport layer, and the electron injection layer may be a common film connected to each other in adjacent pixels.

The color of light generated in the light generation layer may be one of red, green, blue, and white, but is not limited thereto. For example, the color of the light generated in a given light generation layer of a light emitting layer EML may be one of magenta, cyan, and yellow.

A thin film encapsulation film TFE covering the cathode electrode CD may be provided and/or formed on the cathode electrode CD.

The thin film encapsulation film TFE may be formed of a single layer, but may also be formed of multiple layers. The thin film encapsulation film TFE may include insulating films covering the light emitting element OLED. Specifically, the thin film encapsulation film TFE may include at least one inorganic film and at least one organic film. For example, the thin film encapsulation film TFE may have a structure in which at least one inorganic film and at least one organic film are alternately stacked. The thin film encapsulation film TFE may be an encapsulation substrate disposed on the light emitting element OLED and adhered to the substrate SUB through a sealant.

The display device may include a touch sensor (not shown) provided on the thin film encapsulation film TFE. The touch sensor may be disposed on a surface of the display device on which the image is displayed, and may receive a touch input of a user. The touch sensor may recognize a touch event to the display device through a user's hand or a separate input means.

The pixel PXL may include a conductive pattern CP provided and/or formed on the substrate SUB.

The conductive pattern CP may be formed of a conductive material, for example, a metal. The conductive pattern CP may be formed of a single metal, but may be formed of two or more kinds of metals, or an alloy of two or more kinds of metals. The conductive pattern CP may be formed as a single layer or multiple layers. The conductive pattern CP may block light that enters a rear surface of the substrate SUB. The conductive pattern CP may partially overlap the first pixel transistor T1 in a plan view.

The conductive pattern CP may be electrically connected to the upper electrode UE through a seventh contact hole CH7 sequentially passing through the buffer layer BFL, the gate insulating layer GI, and the first interlayer insulating layer ILD1. As described above, as the upper electrode UE may be electrically connected to the first source electrode SE1 of the first pixel transistor T1, the conductive pattern CP may be electrically connected to the first source electrode SE1 through the upper electrode UE. Therefore, a voltage of the same level as the voltage applied to the first source electrode SE1 may be transferred to the conductive pattern CP.

The conductive pattern CP may be an element disposed on the substrate SUB with the first priority. In an embodiment, the conductive pattern CP may be provided between the first pixel transistor T1 and the substrate SUB, and may partially overlap the first pixel transistor T1. The conductive pattern CP may overlap the first active pattern ACT1 of the first pixel transistor T1. When light enters from the rear surface of the substrate SUB, the conductive pattern CP may cover the first active pattern ACT1 to block the light from propagating to the first active pattern ACT1.

When the conductive pattern CP is electrically connected to the first source electrode SE1, a swing width margin of the second driving power ELVSS may be secured. In this and other examples, a driving range of a gate voltage applied to the gate electrode GE1 of the first transistor T1 may be advantageously widened.

Figure 5A:
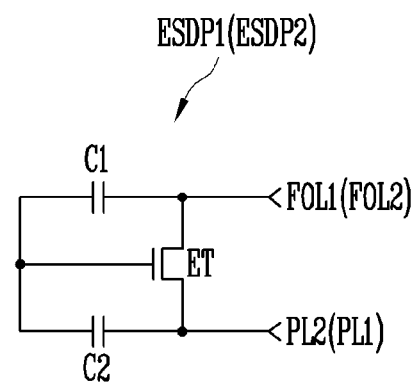
FIG. 5A is an equivalent circuit diagram illustrating first and second electrostatic discharge portions shown in FIG. 1.
Figure 5B:
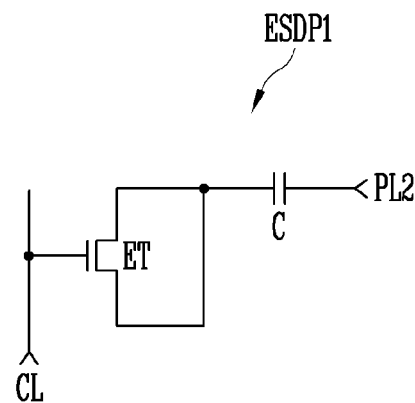
FIG. 5B is an equivalent circuit diagram illustrating the first electrostatic discharge portion of FIG. 5A.

FIG. 5A is an equivalent circuit diagram illustrating the first and second electrostatic discharge portions shown in FIG. 1, and FIG. 5B is an equivalent circuit diagram illustrating the first electrostatic discharge portion of FIG. 5A according to another example.

Referring to FIGS. 1, 2, 5A, and 5B, the display device may include the first electrostatic discharge portion ESDP1 and the second electrostatic discharge portion ESPD2 disposed in the non-display area NDA.

Each of the first and second electrostatic discharge portions ESDP1 and ESDP2 may be connected to a corresponding power line and a corresponding fan-out line and may include at least one transistor ET having an interconnection relationship with the corresponding power line and the corresponding fan-out line. Each of the first and second electrostatic discharge portions ESDP1 and ESDP2 may be designed to have a low impedance in a predetermined high voltage range to discharge an overcurrent, to be broken by itself to block a static electricity inflow, and to have a high impedance in a normal driving environment so as not to influence a signal provided through the corresponding fan-out line.

Each of the first and second electrostatic discharge portions ESDP1 and ESDP2 may include the transistor ET, a first capacitor C1, and a second capacitor C2. The transistor ET of the first electrostatic discharge portion ESDP1 may be connected to the first fan-out line FOL1 to which the scan signal of the scan driver SDV is provided and the second power line PL2 to which the first driving power ELVDD is provided. The transistor ET of the second electrostatic discharge portion ESDP2 may be connected to the second fan-out line FOL2 to which the data signal of the data driver DDV is provided and the first power line PL1 to which the first driving power ELVDD is provided.

For the description purpose, the transistor ET included in the first electrostatic discharge portion ESDP1 is referred to as a "first transistor ET" and the transistor ET included in the second electrostatic discharge portion ESDP2 is referred to as a "second transistor ET."

In the first electrostatic discharge portion ESDP1, the first capacitor C1 may be connected between a gate electrode of the first transistor ET and a first terminal of the first transistor ET and the second capacitor C2 may be connected between the gate electrode of the first transistor ET and a second terminal of the first transistor ET.

In the second electrostatic discharge portion ESDP2, the first capacitor C1 may be connected between a gate electrode of the second transistor ET and a first terminal of the second transistor ET, and the second capacitor C2 may be connected between the gate electrode of the second transistor ET and a second terminal of the second transistor ET.

The first electrostatic discharge portion ESDP1 may be provided to include one transistor ET and one capacitor C as shown in FIG. 5B according to a form (or application form) of the scan driver SDV provided to the display device. When the scan driver SDV is provided in a form including at least one transistor formed through the same process as the pixel circuit of the pixels PXL, the first electrostatic discharge portion ESDP1 may be provide in a form including one transistor ET and one capacitor C as shown in FIG. 5B. In this and other examples, the gate electrode of the transistor ET of the first electrostatic discharge portion ESDP1 may be connected to the clock signal line CL provided to the scan driver SDV, the first terminal and the second terminal of the transistor ET may be electrically connected to one side of the capacitor C, and the other side of the capacitor C may be connected to the second power line PL2.

When the scan driver SDV is provided as a chip on glass type in the non-display area NDA of the substrate SUB as a separate chip, the first electrostatic discharge portion ESDP1 may be provided in a form including one transistor ET and two capacitors C1 and C2 as shown in FIG. 5A.

Figure 6:
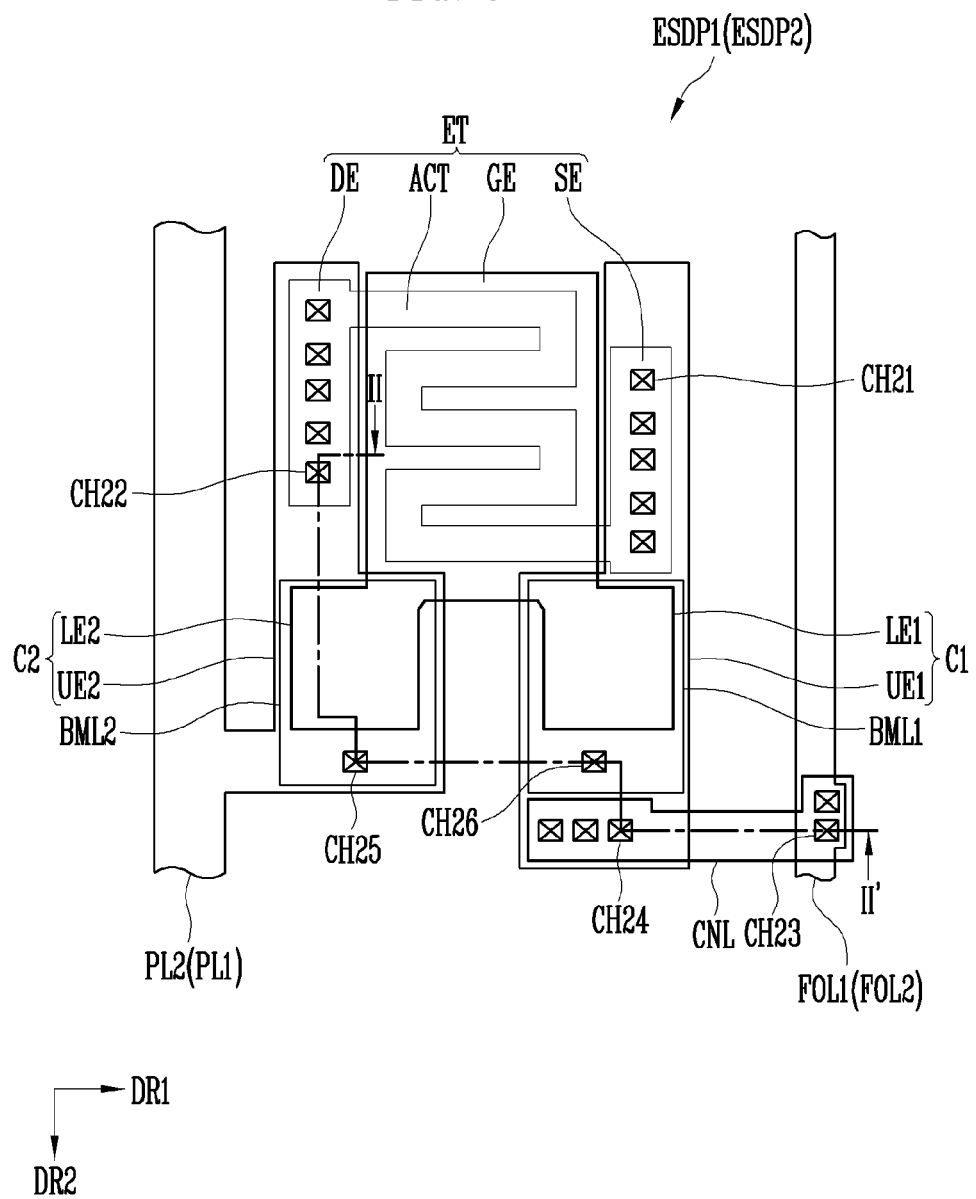
FIG. 6 is a plan view illustrating the first and second electrostatic discharge portions shown in FIG. 5A.
Figure 7:
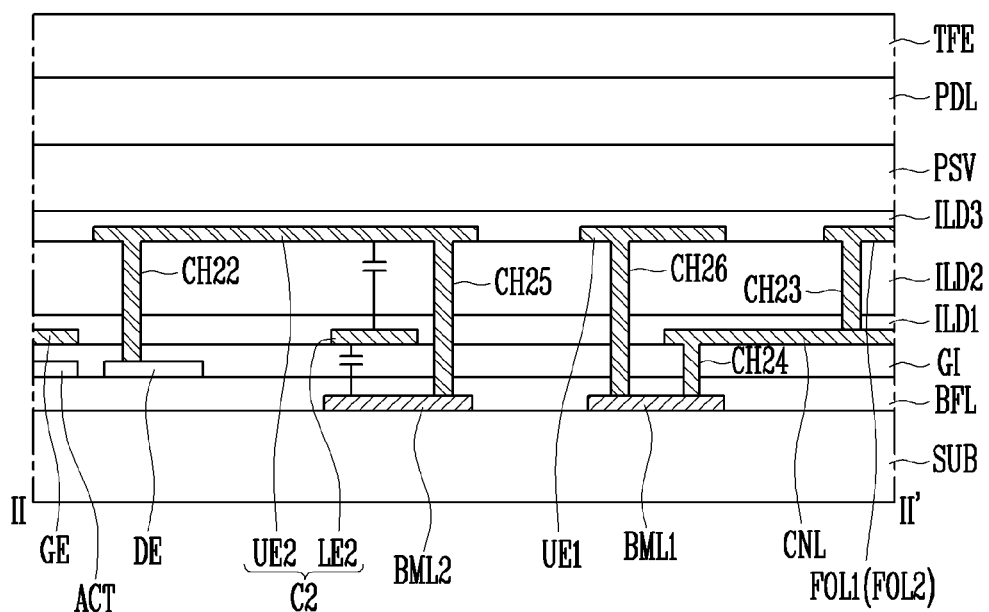
FIG. 7 is a cross-sectional view taken along line II~II' of FIG. 6.

FIG. 6 is a plan view illustrating the first and second electrostatic discharge portions EDSP1 and EDSP2 shown in FIG. 5A, and FIG. 7 is a cross-sectional view taken along a line II~II' of FIG. 6.

In various examples of this disclosure, "provided and/or formed in the same layer" may mean being formed in the same process.

Referring to FIGS. 1 to 5A, 6, and 7, the display device may include the first electrostatic discharge portion ESDP1 connected between the first fan-out line FOL1 and the second power line PL2 in the non-display area NDA of the substrate SUB and the second electrostatic discharge portion ESDP2 connected between the second fan-out line FOL2 and the first power line PL1.

Each of the first and second fan-out lines FOL1 and FOL2 may extend along the second direction DR2 on the substrate SUB. The scan signal generated in the scan driver SDV may be applied to the first fan-out line FOL1 and the data signal generated in the data driver DDV may be applied to the second fan-out line FOL2. The first fan-out line FOL1 may be a sensing line for applying the control signal to the i-th control line CLi for sensing the deterioration information of the light emitting element OLED by turning on the third pixel transistor T3 of each pixel PXL during the sensing period.

Each of the first and second power lines PL1 and PL2 may extend along the first direction DR1 on the substrate SUB and may be disposed apart from the corresponding fan-out line in a plan view. For example, the first power line PL1 may be spaced apart from the second fan-out line FOL2 in a plan view, and the second power line PL2 may be spaced apart from the first fan-out line FOL1 in a plan view.

Each of the first and second electrostatic discharge portions ESDP1 and ESDP2 may include first and second bottom metal layers BML1 and BML2, the transistor ET, the first and second capacitors C1 and C2. The first electrostatic discharge portion ESDP1 and the second electrostatic discharge portion ESDP2 may have substantially the same or similar structure. In the following description, the first electrostatic discharge portion ESDP1 of the first and second electrostatic discharge portions ESDP1 and ESDP2 will be representatively described for the sake of convenience.

The first electrostatic discharge portion ESDP1 may include the transistor ET, the first and second capacitors C1 and C2, and the first and second bottom metal layers BML1 and BML2.

The transistor ET may include a gate electrode GE, an active pattern ACT, a source electrode SE, and a drain electrode DE.

The gate electrode GE may be provided in the same layer as the scan line SL connected to each of the pixels PXL of the display area DA and may include the same material as the scan line SL.

The active pattern ACT, the source electrode SE, and the drain electrode DE may be formed of a semiconductor layer that is not doped (injected) with an impurity or doped (or injected) with the impurity. For example, the source electrode SE and the drain electrode DE may be formed of a semiconductor layer doped (or injected) with an impurity, and the active pattern ACT may be formed of a semiconductor layer that is not doped (or injected) with the impurity.

The active pattern ACT may extend in a predetermined direction and may have a shape bent several times along an extended longitudinal direction. The active pattern ACT may overlap the gate electrode GE in a plan view. Since the active pattern ACT is formed as a long structure, a channel region of the transistor ET may be formed long.

One end of the source electrode SE may be connected to one end of the active pattern ACT. The other end of the source electrode SE may be connected to a first upper electrode UE1 of the first capacitor C1 through a twenty-first contact hole CH21 sequentially passing through the gate insulating layer GI and the first and second interlayer insulating layers ILD1 and ILD2.

One end of the drain electrode DE may be connected to the other end of the active pattern ACT. The other end of the drain electrode DE may be electrically connected a second upper electrode UE2 of the second capacitor C2 through a twenty-second contact hole CH22 sequentially passing through the gate insulating layer GI and the first and second interlayer insulating layers ILD1 and ILD2.

The first capacitor C1 may include the first lower electrode LE1 and the first upper electrode UE1.

The first lower electrode LE1 may be integral with the gate electrode GE of the transistor ET. When the first lower electrode LE1 is provided integrally with the gate electrode GE, the first lower electrode LE1 may be one region of the gate electrode GE. The first lower electrode LE1 may not be provided integrally with the gate electrode GE of the transistor ET, but in other examples may be provided in a layer different from that of the gate electrode GE of the transistor ET.

The first upper electrode UE1 may be provided in a form extending along the second direction DR2 and may overlap the first lower electrode LE1. The first upper electrode UE1 may cover the first lower electrode LE1 in a plan view. A capacitance of the first capacitor C1 may be increased by increasing an overlapping area of the first upper electrode UE1 and the first lower electrode LE1. The first upper electrode UE1 may be electrically connected to the first bottom metal layer BML1 through a twenty-second contact hole CH26 sequentially passing through the buffer layer BFL, the gate insulating layer GI, and the first and second interlayer insulating layers ILD1 and ILD2. The first upper electrode UE1 may completely cover the drain electrode DE and may not cover the active pattern ACT in a plan view. The first upper electrode UE1 may not cover the gate electrode GE overlapping the active pattern ACT.

Similar to the first capacitor C1, the second capacitor C2 may include a second lower electrode LE2 and a second upper electrode UE2.

The second lower electrode LE2 of the second capacitor may be integral with the gate electrode GE of the transistor ET. When the second lower electrode LE2 is provided integrally with the gate electrode GE, the second lower electrode LE2 may be one region of the gate electrode GE. In an example of the disclosure, each of the first lower electrode LE1 and the second lower electrode LE2 may be one region of the gate electrode GE. According to an example, the second lower electrode LE2 may not be provided integrally with the gate electrode GE of the transistor ET, but in other examples may be provided in a layer different from that of the gate electrode GE of the transistor ET.

The second upper electrode UE2 may be provided in a form extending along the second direction DR2 and may overlap the second lower electrode LE2. The second upper electrode UE2 may cover the second lower electrode LE2 in a plan view. A capacitance of the second capacitor C2 may be increased by increasing an overlapping area of the second upper electrode UE2 and the second lower electrode LE2. The second upper electrode UE2 may be electrically connected to the second bottom metal layer BML2 through a twenty-fifth contact hole CH25 sequentially passing through the buffer layer BFL, the gate insulating layer GI, and the first and second interlayer insulating layers ILD1 and ILD2. The second upper electrode UE2 may completely cover the source electrode SE and may not cover the active pattern ACT in a plan view. The second upper electrode UE2 may not cover the gate electrode GE overlapping the active pattern ACT.

The second upper electrode UE2 may be integral with the second power line PL2. When the second upper electrode UE2 is provided integrally with the second power line PL2, the second upper electrode UE2 may be one region of the second power line PL2. The second upper electrode UE2 may not be provided integrally with the second power line PL2 but may be provided in a layer different from that of the second power line PL2. For example, the second upper electrode UE2 may be provided in the same layer as the bridge pattern BRP of each pixel PXL or may be provided in the same layer as the anode electrode AD of each pixel PXL.

The first bottom metal layer BML1 may be provided on the substrate SUB and may overlap the first lower electrode LE1 and the first upper electrode UE1. The first bottom metal layer BML1 may be electrically connected to the first upper electrode UE1 through a twenty-sixth contact hole CH26. The first bottom metal layer BML1 may be electrically connected to the first fan-out line FOL1 through a connection line CNL.

The connection line CNL is provided in a form extending along the first direction DR1 and may be a medium for electrically connecting the first bottom metal layer BML1 and the first fan-out line FOL1 with each other. In a plan view, one end of the connection wiring CNL may overlap the first bottom metal layer BML1, and the other end of the connection wiring CNL may overlap the first fan-out line FOL1.

One end of the connection wiring CNL may be electrically connected to the first bottom metal layer BML1 through a twenty-fourth contact hole CH24 sequentially passing through the buffer layer BFL and the gate insulating layer GI. The other end of the connection wiring CNL may be electrically connected to the first fan-out line FOL1 through a twenty-third contact hole CH23 sequentially passing through the first and second interlayer insulating layers ILD1 and ILD2. The connection wiring CNL may be provided in the same layer as the gate electrode GE and may include the same material as the gate electrode GE. The connection wiring CNL may be provided on the gate insulating layer GI, but the disclosure is not limited thereto. The connection wiring CNL may be provided and/or formed on the first interlayer insulating layer ILD1 between the first fan-out line FOL1 and the first bottom metal layer BML1.

The first bottom metal layer BML1 may be formed of a conductive material, for example, a metal. The first bottom metal layer BML1 may be formed of a single metal, but may be formed of two or more kinds of metals, or an alloy of two or more kinds of metals in other examples. The first bottom metal layer BML1 may be formed as a single layer or a multilayer. The first bottom metal layer BML may be provided and/or formed in the same layer as the conductive pattern CP of each of the pixels PXL of the display area DA, and may include the same material as the conductive pattern CP.

The second bottom metal layer BML2 may be disposed on the substrate SUB to be spaced apart from the first bottom metal layer BML1. The second bottom metal layer BML2 may be provided and/or formed in the same layer as the first bottom metal layer BML1, and may include the same material as the first bottom metal layer BML1. The second bottom metal layer BML2 may overlap the second lower electrode LE2 and the second upper electrode UE2. The second bottom metal layer BML2 may be electrically connected to the second upper electrode UE2 through the twenty-fifth contact hole CH25. As described above, since the second upper electrode UE2 is one region of the second power line PL2, the second bottom metal layer BML2 may be electrically connected to the second power line PL2.

Referring now to FIGS. 6 and 7, a structure of the first electrostatic discharge portion ESDP1 will be described in the order of stack.

The first and second bottom metal layers BML1 and BML2 of the first electrostatic discharge portion ESDP1 may be provided and/or formed on the non-display area NDA of the substrate SUB.

Further, the buffer layer BFL may be provided and/or formed on the first and second bottom metal layers BML1 and BML2. The buffer layer BFL may be an inorganic insulating film including an inorganic material. The buffer layer BFL may prevent an impurity from diffusing to the transistor ET. The buffer layer BFL may be provided as a single layer, but may also be provided as multiple layers of at least two or more layers in other examples. When the buffer layer BFL is provided in multiple layers, each layer may be formed of the same material or formed of different materials. The buffer layer BFL may be omitted according to a material and a process condition of the substrate SUB.

The active pattern ACT may be formed and/or provided on the buffer layer BFL.

The source electrode SE and the drain electrode DE that are in contact with both ends of the active pattern ACT may be formed by forming the gate electrode GE on the substrate SUB and then injecting (or doping) an impurity.

The gate insulating layer GI may be formed and/or provided on the active pattern ACT. The gate insulating layer GI may be an inorganic insulating film including an inorganic material.

The gate electrode GE and the connection wiring CNL may be provided on the gate insulating layer GI. The gate electrode GE may include the first lower electrode LE1 of the first capacitor C1 and the second lower electrode LE2 of the second capacitor C2.

The connection wiring CNL may be electrically connected to the first bottom metal layer BML1 through the twenty-fourth contact hole CH24 sequentially passing through the buffer layer BFL and the gate insulating layer GI.

The first interlayer insulating layer ILD1 and the second interlayer insulating layer ILD2 may be sequentially formed and/or provided on the gate insulating layer GI including the gate electrode GE and the like. Each of the first interlayer insulating layer ILD1 and the second interlayer insulating layer ILD2 may be an inorganic insulating film including an inorganic material, but the disclosure is not limited thereto.

The second power line PL2, the first fan-out line FOL1, the first upper electrode UE1, and the second upper electrode UE2 may be provided and/or formed on the second interlayer insulating layer ILD2. The second power line PL2 may be provided integrally with the second upper electrode UE2.

The first fan-out line FOL1 may be electrically connected to the connection wiring CNL through the twenty-third contact hole CH23 sequentially passing through the first and second interlayer insulating layers ILD1 and ILD2.

The first upper electrode UE1 may be connected to the first bottom metal layer BML1 through the twenty-sixth contact hole CH26 sequentially passing through the buffer layer BFL, the gate insulating layer GI, and the first and second interlayer insulating layers ILD1 and ILD2.

The first upper electrode UE1 overlaps the first lower electrode LE1 with the first interlayer insulating layer ILD1 and the second interlayer insulating layer ILD2 interposed therebetween to form the first capacitor C1.

The first lower electrode LE1 may overlap the first bottom metal layer BML1 with the buffer layer BFL and the gate insulating layer GI interposed therebetween to form the additional capacitor. The additional capacitor may increase the capacitance of the first capacitor C1.

The second upper electrode UE2 may be electrically connected to the second bottom metal layer BML2 through the twenty-fifth contact hole CH25 sequentially passing through the buffer layer BFL, the gate insulating layer GI, and the first and second interlayer insulating layers ILD1 and ILD2.

The second upper electrode UE2 may overlap the second lower electrode LE2 with the first interlayer insulating layer ILD1 and the second interlayer insulating layer ILD2 interposed therebetween to form the second capacitor C2. The second lower electrode LE2 may overlap the second bottom metal layer BML2 with the buffer layer BFL and the gate insulating layer GI interposed therebetween to form the additional capacitor. The additional capacitor may further increase the capacitance of the second capacitor C2.

The protection layer PSV, the pixel definition layer PDL, and the thin film encapsulation film TFE may be sequentially provided and/or formed on the first and second upper electrodes UE1 and UE2.

As described above, in an example of the disclosure, the first bottom metal layer BML1 may be disposed between the substrate SUB and the buffer layer BFL to increase the capacitance of the first capacitor C1 without increasing the overlapping area of the first upper electrode UE1 and the first lower electrode LE1. The second bottom metal layer BML2 may be disposed between the substrate SUB and the buffer layer BFL to increase the capacitance of the second capacitor C2 without increasing the overlapping area of the second upper electrode UE2 and the second lower electrode LE2.

As the capacitance of each of the first and second capacitors C1 and C2 is increased, the first electrostatic discharge portion ESDP1 may more stably block the static electricity from flowing from the outside.

When the areas of the first upper electrode UE1 and the first lower electrode LE1 are designed to increase the overlapping area of the first upper electrode UE1 and the first lower electrode LE1 in order to increase the static electricity prevention effect of the first electrostatic discharge portion ESDP1, since the areas of the first upper electrode UE1 and the first lower electrode LE1 are increased, an area occupied by the electrostatic discharge portion ESDP1 in the non-display area NDA may be increased. Similarly, areas of the second upper electrode UE2 and the second lower electrode LE2 are designed to increase the overlapping area of the second upper electrode UE2 and the second lower electrode LE2. As the areas of the second upper electrode UE2 and the second lower electrode LE2 are increased, an area occupied by the first electrostatic discharge portion ESDP1 in the non-display area NDA may similarly be increased. As a result, a dead space of the non-display area NDA may be increased.

Thus, in embodiments of the disclosure, the capacitances of the first and second capacitors C1 and C2 may be increased by disposing the first and second bottom metal layers BML1 and BML2 between the substrate SUB and the buffer layer BFL without increasing the areas of the first and second upper electrodes UE1 and UE2. Accordingly, the dead space of the non-display area NDA may be reduced or minimized by reducing the area occupied by the first electrostatic discharge portion ESDP1 in the non-display area NDA.

The first and second lower electrodes LE1 and LE2 may be integral with the gate electrode GE as described above, but the configuration is not limited thereto. In other examples, the first and second lower electrodes LE1 and LE2 may be provided and/or formed in a configuration separate from the gate electrode GE. For example, the first and second lower electrodes LE1 and LE2 may be provided and/or formed on the first interlayer insulating layer ILD1 and may be electrically connected to the gate electrode GE through a separate connection means.

When the first lower electrode LE1 is provided and/or formed on the first interlayer insulating layer ILD1, the first upper electrode UE1 may form the first capacitor C1 with the first lower electrode LE1 through the second interlayer insulating layer ILD2 interposed therebetween. The first lower electrode LE1 may form the additional capacitor with the first bottom metal layer BML1 through the first interlayer insulating layer ILD1, the gate insulating layer GI, and the buffer layer BFL interposed therebetween.

When the second lower electrode LE2 is provided and/or formed on the first interlayer insulating layer ILD1, the second upper electrode UE2 may form the second capacitor C2 with second lower electrode LE2 through the second interlayer insulating layer ILD2 interposed therebetween. The second lower electrode LE2 may form the additional capacitor with the second bottom metal layer BML2 through the first interlayer insulating layer ILD1, the gate insulating layer GI, and the buffer layer BFL interposed therebetween.

The first and second bottom metal layers BML1 and BML2 may be disposed between the substrate SUB and the buffer layer BFL, but their arrangement is not limited thereto.

In other examples, the first and second bottom metal layers BML1 and BML2 may be provided in the same layer as the active pattern ACT. The first and second bottom metal layers BML1 and BML2 may be doped (or injected) with an impurity usable to provide conductivity. When the first and second bottom metal layers BML1 and BML2 are provided in the same layer as the active pattern ACT, the first bottom metal layer BML1 may overlap the first lower electrode LE1 with the gate insulating layer GI interposed therebetween to form the additional capacitor, and the second bottom metal layer BML2 may overlap the second lower electrode LE2 with the gate insulating layer GI interposed therebetween to form the additional capacitor. The first and second lower electrodes LE1 and LE2 may be provided in the same layer as the upper electrode UE of the storage capacitor Cst of each pixel PXL. The first bottom metal layer BML1 may overlap the first lower electrode LE1 with the gate insulating layer GI and the first interlayer insulating layer ILD1 interposed therebetween to form the additional capacitor, and the second bottom metal layer BML2 may overlap the second lower electrode LE2 with the gate insulating layer GI and the first interlayer insulating layer ILD1 interposed therebetween to form the additional capacitor.

In other examples, the first and second bottom metal layers BML1 and BML2 may be provided in the same layer as the scan line SLi of each pixel PXL on the gate insulating layer GI. When the first and second bottom metal layers BML1 and BML2 are disposed in the same layer as the scan line SLi of each pixel PXL, the first and second lower electrodes LE1 and LE2 may be provided in the same layer as the first power line PL1 of each pixel PXL, and the first and second upper electrodes UE1 and UE2 may be provided in the same layer as the bridge pattern BRP of each pixel PXL. The first upper electrode UE1 may overlap the first lower electrode LE1 with the third interlayer insulating layer ILD3 interposed therebetween to form the first capacitor C1, and the first lower electrode LE1 may form the additional capacitor with the first bottom metal layer BML1 through the first and second interlayer insulating layers ILD1 and ILD2 interposed therebetween. The second upper electrode UE2 may overlap the second lower electrode LE2 with the third interlayer insulating layer ILD3 interposed therebetween to form the second capacitor C2, and the second lower electrode LE2 may form the additional capacitor with the second bottom metal layer BML2 through the first and second interlayer insulating layers ILD1 and ILD2 interposed therebetween. The first and second upper electrodes UE1 and UE2 are provided on the third interlayer insulating layer ILD3, but their configuration is not limited thereto. In other examples, the first and second upper electrodes UE1 and UE2 may be provided in the same layer as the anode electrode AD of each pixel PXL.

As described above, each of the first and second capacitors C1 and C2 of each of the first and second electrostatic discharge portions ESDP1 and ESDP2 may have a capacitance configured of a combination of three conductive layers disposed in different layers with at least one layer interposed therebetween, among the conductive layers included in each pixel PXL.

Figure 8:
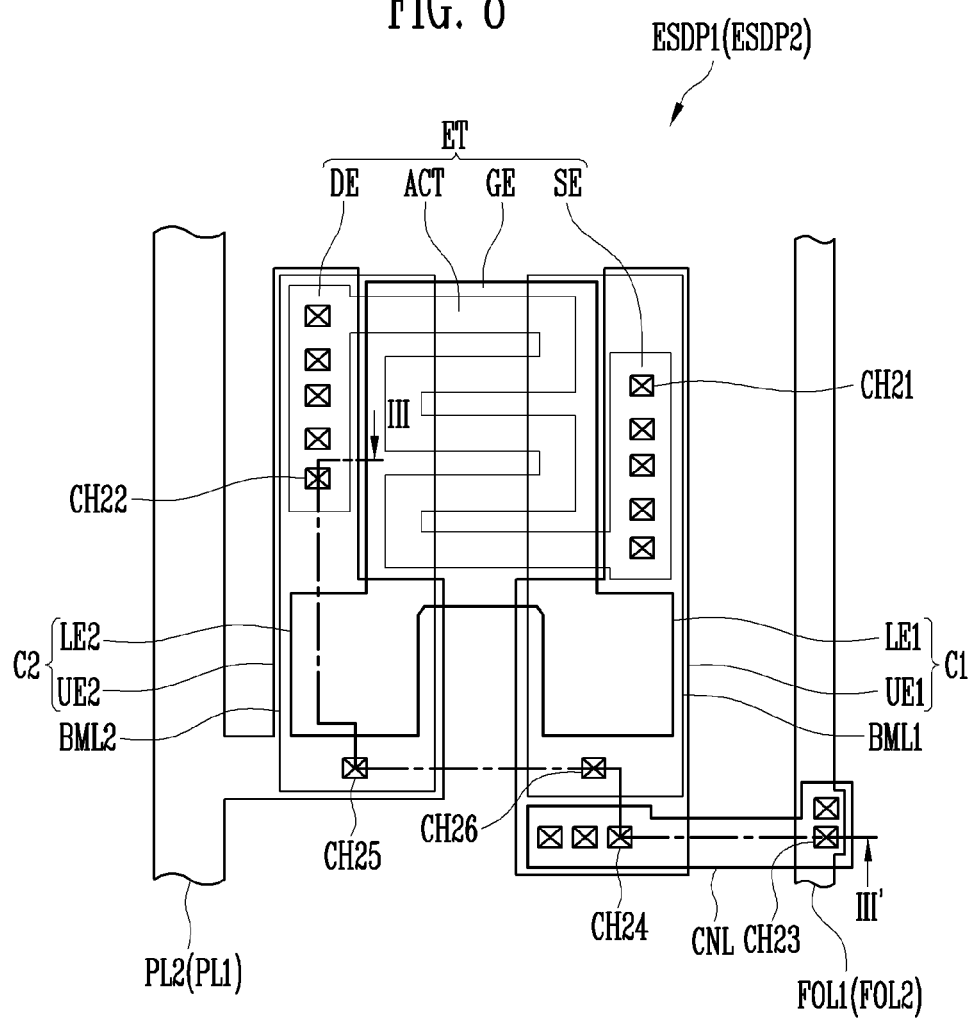
FIG. 8 is a plan view of the first and second electrostatic discharge portions of FIG. 6 according to another embodiment.
Figure 9:
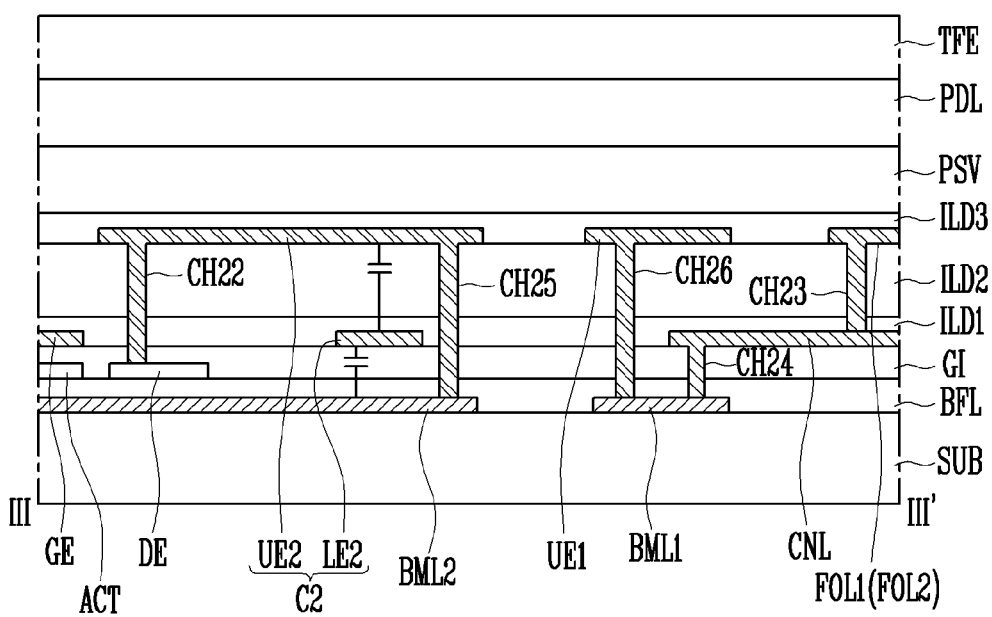
FIG. 9 is a cross-sectional view taken along line III~III' of FIG. 8.

FIG. 8 is a plan view of the first and second electrostatic discharge portions of FIG. 6 according to another embodiment, and FIG. 9 is a cross-sectional view taken along a line III~III' of FIG. 8.

The first and second electrostatic discharge portions shown in FIGS. 8 and 9 may have a configuration substantially the same or similar to the first and second electrostatic discharge portions of FIGS. 6 and 7, except that each of the first and second bottom metal layers overlaps the gate electrode of the corresponding transistor.

Therefore, in order to avoid repetitive description, the first and second electrostatic discharge portions of FIGS. 8 and 9 will be described mainly in terms of points different from the above-described embodiment. The parts that are not specifically described in the this embodiment are in accordance with the embodiment described above, the same reference numerals denote the same elements, and the similar reference numerals denote the similar elements.

FIGS. 8 and 9 illustrate a structure of the first and second electrostatic discharge portions by simplifying the structure of the first and second electrostatic discharge portions such as illustrating each electrode as a single electrode layer and each insulating layer as a single insulating layer. However, their structure is not limited thereto.

Referring to FIGS. 1, 5A, 8, and 9, the first electrostatic discharge portion ESDP1 may be connected between the second power line PL2 and the first fan-out line FOL1, and the second electrostatic discharge portion ESDP2 may be connected between the first power line PL1 and the second fan-out line FOL2.

The first driving power (refer to ELVDD of FIG. 2) of the same level may be applied to the first power line PL1 and the second power line PL2. The scan signal generated in the scan driver SDV may be applied to the first fan-out line FOL1 and the data signal generated in the data driver DDV may be applied to the second fan-out line FOL2. The first fan-out line FOL1 may be the sensing line for applying the control signal to the i-th control line CLi in order to sense the deterioration information of the light emitting element OLED by turning on the third pixel transistor T3 of each pixel PXL during the sensing period.

Each of the first and second electrostatic discharge portions ESDP1 and ESDP2 may include the first and second bottom metal layers BML1 and BML2, the transistor ET, the connection wiring CNL, and the first and second capacitors C1 and C2.

The transistor ET of each of the first and second electrostatic discharge portions ESDP1 and ESDP2 may include the gate electrode GE, the active pattern ACT, the source electrode SE, and the drain electrode DE.

The first capacitor C1 of each of the first and second electrostatic discharge portions ESDP1 and ESDP2 may include the first lower electrode LE1 and the first upper electrode UE1, and the second capacitor C2 of each of the first and second electrostatic discharge portions ESDP1 and ESDP2 may include the second lower electrode LE2 and the second upper electrode UE2.

The first bottom metal layer BML1 of each of the first and second electrostatic discharge portions ESDP1 and ESDP2 may overlap the first lower electrode LE1 of the corresponding first capacitor C1. Therefore, the first bottom metal layer BML1 of each of the first and second electrostatic discharge portions ESDP1 and ESDP2 may form the additional capacitor with the first lower electrode LE1 of the corresponding first capacitor C1 through the buffer layer BFL and the gate insulating layer GI interposed therebetween. The additional capacitor may increase the capacitance of the first capacitor C1.

The first bottom metal layer BML1 of each of the first and second electrostatic discharge portions ESDP1 and ESDP2 may be provided in a form extending in the second direction DR2 and may overlap the gate electrode GE of the corresponding transistor ET. Therefore, the first bottom metal layer BML1 of each of the first and second electrostatic discharge portions ESDP1 and ESDP2 may form the additional capacitor with the gate electrode GE of the corresponding transistor ET through the buffer layer BFL and the gate insulating layer GI interposed therebetween. The additional capacitor may further increase the capacitance of the first capacitor C1 of each of the first and second electrostatic discharge portions ESDP1 and ESDP2.

The second bottom metal layer BML2 of each of the first and second electrostatic discharge portions ESDP1 and ESDP2 may overlap the second lower electrode LE2 of the corresponding second capacitor C2. Therefore, the second bottom metal layer BML2 of each of the first and second electrostatic discharge portions ESDP1 and ESDP2 may form the additional capacitor with the second capacitors C2 through the buffer layer BFL and the gate insulating layer GI interposed therebetween. The additional capacitor may increase the capacitance of the second capacitor C2.

The second bottom metal layer BML2 of each of the first and second electrostatic discharge portions ESDP1 and ESDP2 may be provided in a form extending in the second direction DR2 and may overlap the gate electrode GE of the corresponding transistor ET. Therefore, the second bottom metal layer BML2 of each of the first and second electrostatic discharge portions ESDP1 and ESDP2 may form the additional capacitor with the gate electrode GE of the corresponding transistor ET through the buffer layer BFL and the gate insulating layer GI interposed therebetween. The additional capacitor may further increase the capacitance of the second capacitor C2.

As described above, as the capacitances of each of the first and second capacitors C1 and C2 are increased, the first and second electrostatic discharge portions ESDP1 and ESDP2 may more stably block the static electricity from flowing from the outside.

Figure 10:
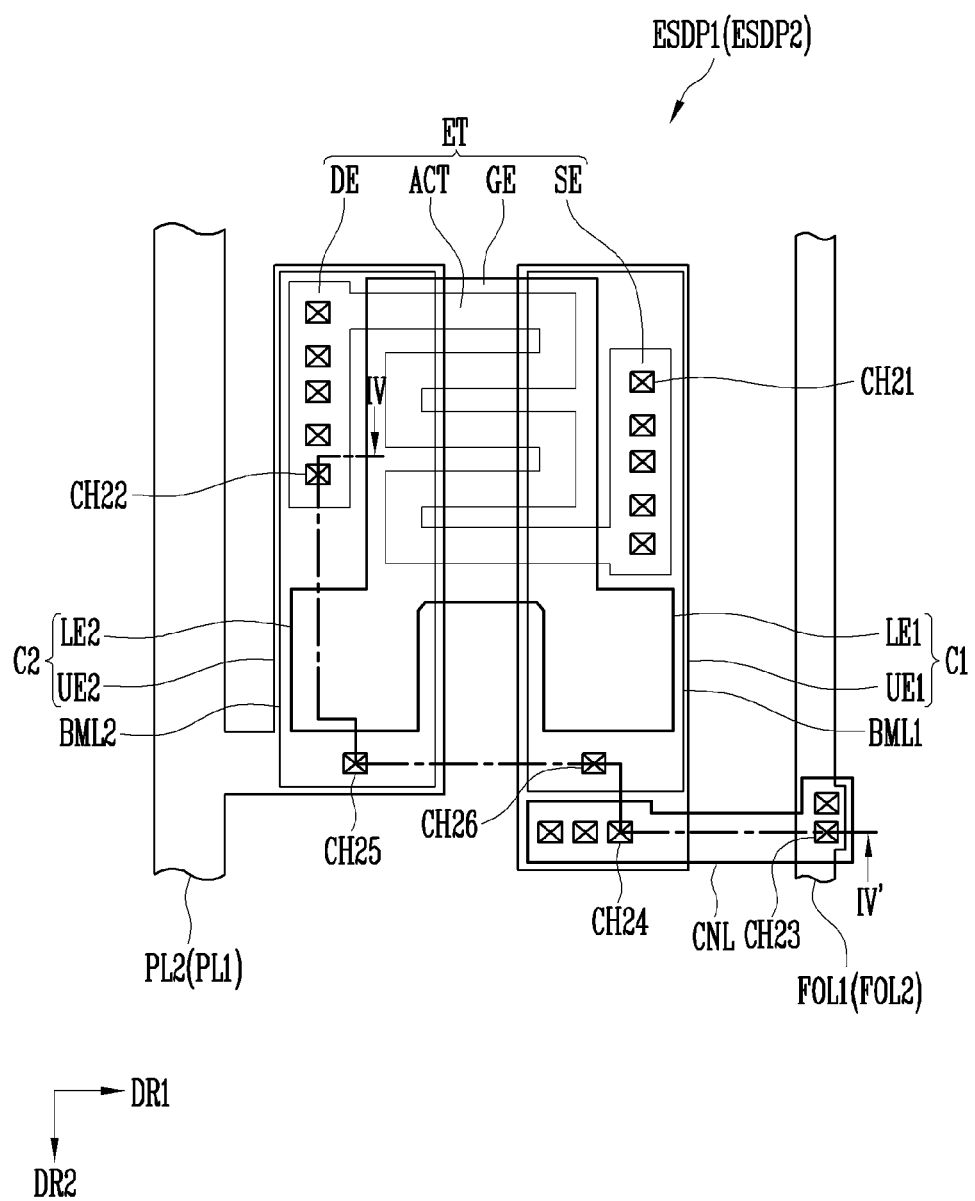
FIG. 10 is a plan view of the first and second electrostatic discharge portions of FIG. 8 according to another embodiment.
Figure 11:
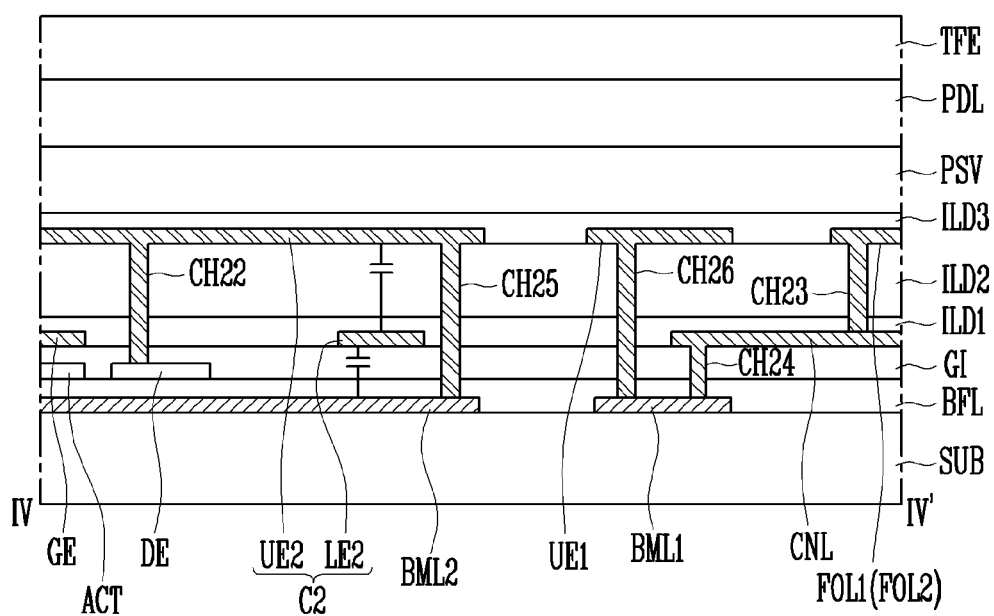
FIG. 11 is a cross-sectional view taken along line IV~IV' of FIG. 10.

FIG. 10 is a plan view of the first and second electrostatic discharge portions of FIG. 8 according to another embodiment, and FIG. 11 is a cross-sectional view taken along a line IV~IV' of FIG. 10.

The first and second electrostatic discharge portions shown in FIGS. 10 and 11 may have a configuration substantially the same or similar to the first and second electrostatic discharge portions of FIGS. 8 and 9, except that each of the first and second upper electrodes overlaps the gate electrode of the corresponding transistor.

In order to avoid repetitive description, the first and second electrostatic discharge portions of FIGS. 10 and 11 will be described mainly in terms of points different from the above-described embodiment. The parts that are not specifically described in the this embodiment are in accordance with the embodiment described above, the same reference numerals denote the same elements, and the similar reference numerals denote the similar elements.

FIGS. 10 and 11 illustrate a structure of the first and second electrostatic discharge portions by simplifying the structure of the first and second electrostatic discharge portions such as illustrating each electrode as a single electrode layer and each insulating layer as a single insulating layer. However, their structure is not limited thereto.

Referring to FIGS. 1, 5A, 9, and 10, the first electrostatic discharge portion ESDP1 may be connected between the second power line PL2 and the first fan-out line FOL1, and the second electrostatic discharge portion ESDP2 may be connected between the first power line PL1 and the second fan-out line FOL2. The first fan-out line FOL1 may be the sensing line for applying the control signal to the i-th control line CLi in order to sense the deterioration information of the light emitting element OLED by turning on the third pixel transistor T3 of each pixel PXL during the sensing period.

Each of the first and second electrostatic discharge portions ESDP1 and ESDP2 may include the first and second bottom metal layers BML1 and BML2, the transistor ET, the connection wiring CNL, and the first and second capacitors C1 and C2.

The transistor ET of each of the first and second electrostatic discharge portions ESDP1 and ESDP2 may include the gate electrode GE, the active pattern ACT, the source electrode SE, and the drain electrode DE.

The first capacitor C1 of each of the first and second electrostatic discharge portions ESDP1 and ESDP2 may include the first lower electrode LE1 and the first upper electrode UE1, and the second capacitor C2 of each of the first and second electrostatic discharge portions ESDP1 and ESDP2 may include the second lower electrode LE2 and the second upper electrode UE2.

The first bottom metal layer BML1 of each of the first and second electrostatic discharge portions ESDP1 and ESDP2 may be provided in a form extending in the second direction DR2 and may overlap the gate electrode GE of the corresponding transistor ET. Therefore, the first bottom metal layer BML1 of each of the first and second electrostatic discharge portions ESDP1 and ESDP2 may form the additional capacitor with the gate electrode GE of the corresponding transistor ET through the buffer layer BFL and the gate insulating layer GI interposed therebetween. The additional capacitor may increase the capacitance of the first capacitor C1 of each of the first and second electrostatic discharge portions ESDP1 and ESDP2.

The first upper electrode UE1 of each of the first and second electrostatic discharge portions ESDP1 and ESDP2 may be provided in a form extending in the second direction DR2 and may overlap the gate electrode GE of the corresponding transistor ET in a plan view. Since the gate electrode GE is integral with the first lower electrode LE1 of the first capacitor C1, the overlapping area of the first upper electrode UE1 and the first lower electrode LE1 of each of the first and second electrostatic discharge portions ESDP1 and ESDP2 may be increased. The increase of the overlapping area of the first upper electrode UE1 and the first lower electrode LE1 may further increase the capacitance of the first capacitor C1 of each of the first and second electrostatic discharge portions ESDP1 and ESDP2.

The second bottom metal layer BML2 of each of the first and second electrostatic discharge portions ESDP1 and ESDP2 may be provided in a form extending along the second direction DR2 and may overlap the gate electrode GE of the corresponding transistor ET. Therefore, the second bottom metal layer BML2 of each of the first and second electrostatic discharge portions ESDP1 and ESDP2 may form the additional capacitor with the gate electrode GE of the corresponding transistor ET through the buffer layer BFL and the gate insulating layer GI interposed therebetween. The additional capacitor may increase the capacitance of the second capacitor C2 of each of the first and second electrostatic discharge portions ESDP1 and ESDP2.

The second upper electrode UE2 of each of the first and second electrostatic discharge portions ESDP1 and ESDP2 may be provided in a form extending in the second direction DR2 and may overlap the gate electrode GE of the corresponding transistor ET in a plan view. Since the gate electrode GE is integral with the second lower electrode LE2 of the second capacitor C2, the overlapping area of the second upper electrode UE2 and the second lower electrode LE2 of each of the first and second electrostatic discharge portions ESDP1 and ESDP2 may be increased. The increase of the overlapping area of the second upper electrode UE2 and the second lower electrode LE2 may further increase the capacitance of the second capacitor C2 of each of the first and second electrostatic discharge portions ESDP1 and ESDP2.

As described above, as the capacitances of the first and second capacitors C1 and C2 are increased, the first and second electrostatic discharge portions ESDP1 and ESDP2 may more stably block the static electricity from flowing from the outside.

Figure 12:
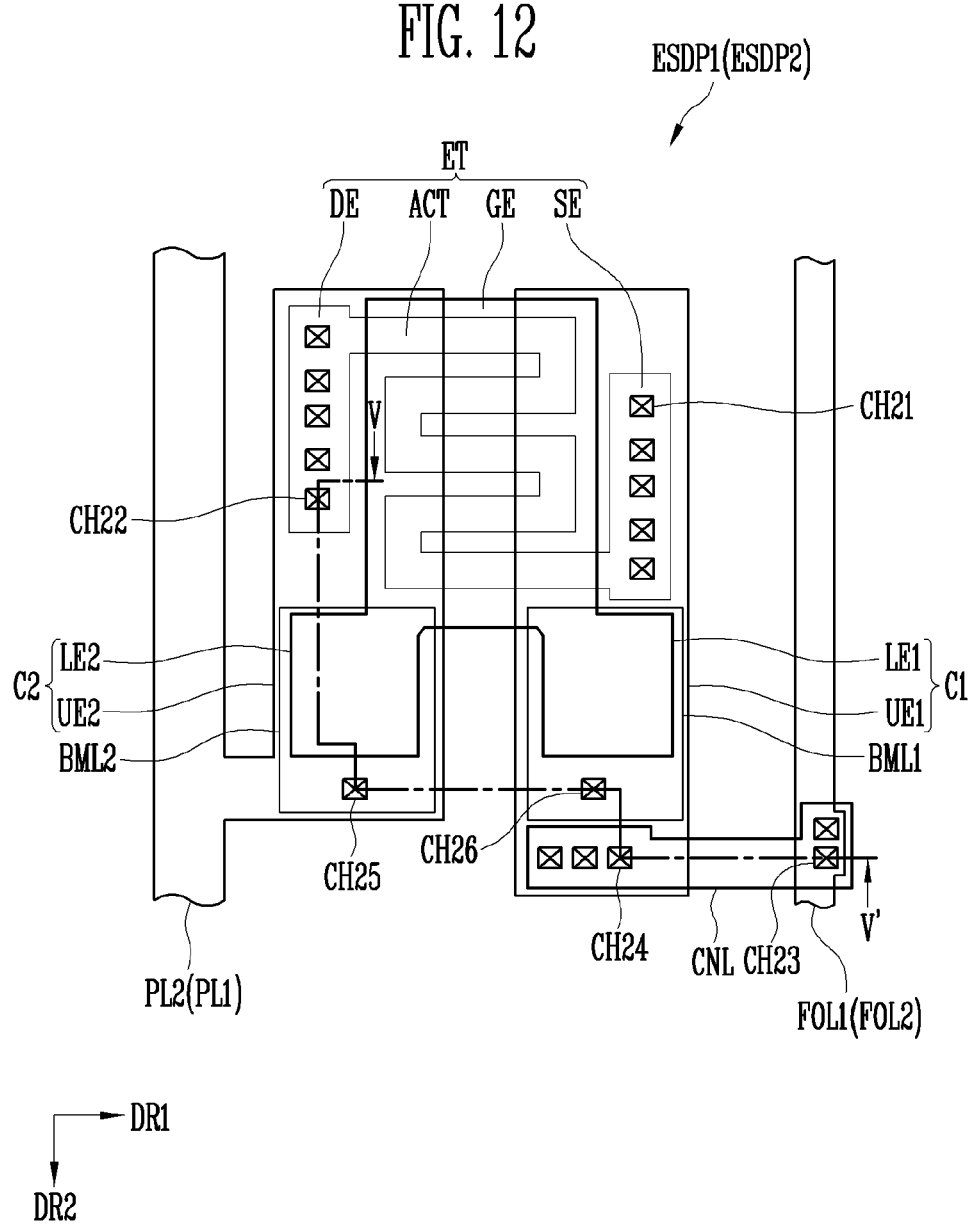
FIG. 12 is a plan view of the first and second electrostatic discharge portions of FIG. 6 according to another embodiment.
Figure 13:
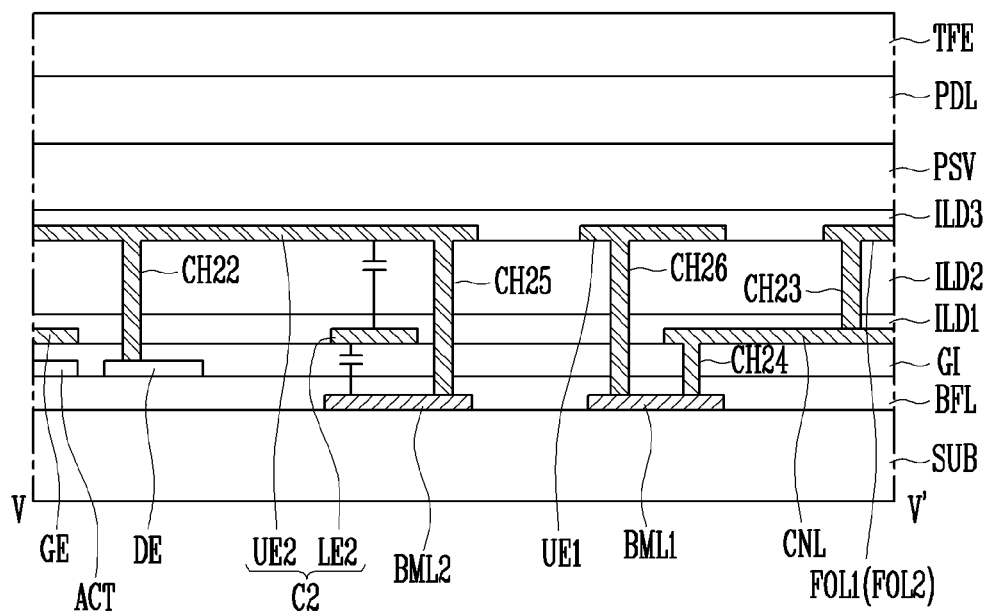
FIG. 13 is a cross-sectional view taken along line V~V' of FIG. 12.

FIG. 12 is a plan view of the first and second electrostatic discharge portions of FIG. 6 according to another embodiment, and FIG. 13 is a cross-sectional view taken along a line V~V' of FIG. 12.

The first and second electrostatic discharge portions shown in FIGS. 12 and 13 may have a configuration substantially the same or similar to the first and second electrostatic discharge portions of FIGS. 6 and 7, except that each of the first and second upper electrodes overlaps the gate electrode of the corresponding transistor.

In order to avoid repetitive description, the first and second electrostatic discharge portions of FIGS. 12 and 13 will be described mainly in terms of points different from the above-described embodiment. The parts that are not specifically described in the this embodiment are in accordance with the embodiment described above, the same reference numerals denote the same elements, and the similar reference numerals denote the similar elements. FIGS. 12 and 13 illustrate a structure of the first and second electrostatic discharge portions by simplifying the structure of the first and second electrostatic discharge portions such as illustrating each electrode as a single electrode layer and each insulating layer as a single insulating layer. However, their structure is not limited thereto.

Referring to FIGS. 1, 5A, 12, and 13, the first electrostatic discharge portion ESDP1 may be connected between the second power line PL2 and the first fan-out line FOL1, and the second electrostatic discharge portion ESDP2 may be connected between the first power line PL1 and the second fan-out line FOL2. The first fan-out line FOL1 may be the sensing line for applying the control signal to the i-th control line CLi in order to sense the deterioration information of the light emitting element OLED by turning on the third pixel transistor T3 of each pixel PXL during the sensing period.

Each of the first and second electrostatic discharge portions ESDP1 and ESDP2 may include the first and second bottom metal layers BML1 and BML2, the transistor ET, the connection wiring CNL, and the first and second capacitors C1 and C2.

The transistor ET of each of the first and second electrostatic discharge portions ESDP1 and ESDP2 may include the gate electrode GE, the active pattern ACT, the source electrode SE, and the drain electrode DE.

The first capacitor C1 of each of the first and second electrostatic discharge portions ESDP1 and ESDP2 may include the first lower electrode LE1 and the first upper electrode UE1, and the second capacitor C2 of each of the first and second electrostatic discharge portions ESDP1 and ESDP2 may include the second lower electrode LE2 and the second upper electrode UE2.

The first upper electrode UE1 and the second upper electrode UE2 of each of the first and second electrostatic discharge portions ESDP1 and ESDP2 may be provided in a bar shape extending along the second direction DR2 and may be disposed apart from each other at regular intervals on the same plane.

The first upper electrode UE1 of each of the first and second electrostatic discharge portions ESDP1 and ESDP2 may overlap each of the first lower electrode LE1 of the corresponding first capacitor C1 and the gate electrode GE of the corresponding transistor ET. Since the gate electrode GE and the first lower electrode LE1 are provided integrally with each other, the overlapping area of the first upper electrode UE1 and the first lower electrode LE1 of each of the first and second electrostatic discharge portions ESDP1 and ESDP2 may be increased. The increase of the overlapping area of the first upper electrode UE1 and the first lower electrode LE1 may further increase the capacitance of the first capacitor C1 of each of the first and second electrostatic discharge portions ESDP1 and ESDP2.

The second upper electrode UE2 of each of the first and second electrostatic discharge portions ESDP1 and ESDP2 may overlap each of the second lower electrode LE2 of the corresponding second capacitor C2 and the gate electrode GE of the corresponding transistor ET. Since the gate electrode GE and the second lower electrode LE2 are provided integrally, the overlapping area of the second upper electrode UE2 and the second lower electrode LE2 of each of the first and second electrostatic discharge portions ESDP1 and ESDP2 may be increased. The increase of the overlapping area of the second upper electrode UE2 and the second lower electrode LE2 may further increase the capacitance of the second capacitor C2 of each of the first and second electrostatic discharge portions ESDP1 and ESDP2.

As described above, as the capacitances of the first and second capacitors C1 and C2 are increased, the first and second electrostatic discharge portions ESDP1 and ESDP2 may more stably block the static electricity from flowing from the outside.

In various examples of the disclosure as described above, the first and second bottom metal layers BML1 and BML2 may be disposed in the first and second electrostatic discharge portions ESDP1 and ESDP2 to increase the capacitances of each of the second capacitors C1 and C2, and thus reliability of the first and second electrostatic discharge portions ESDP1 and ESDP2 may be further improved.

The display device may increase the capacitances of the first and second capacitors C1 and C2 without increasing the area of the first and second capacitors C1 and C2, and thus the area occupied by the first and second electrostatic discharge portions ESDP1 and ESDP2 in the non-display area NDA may be reduced. Therefore, the display device may reduce or minimize the dead space of the non-display area NDA.

Figure 14:
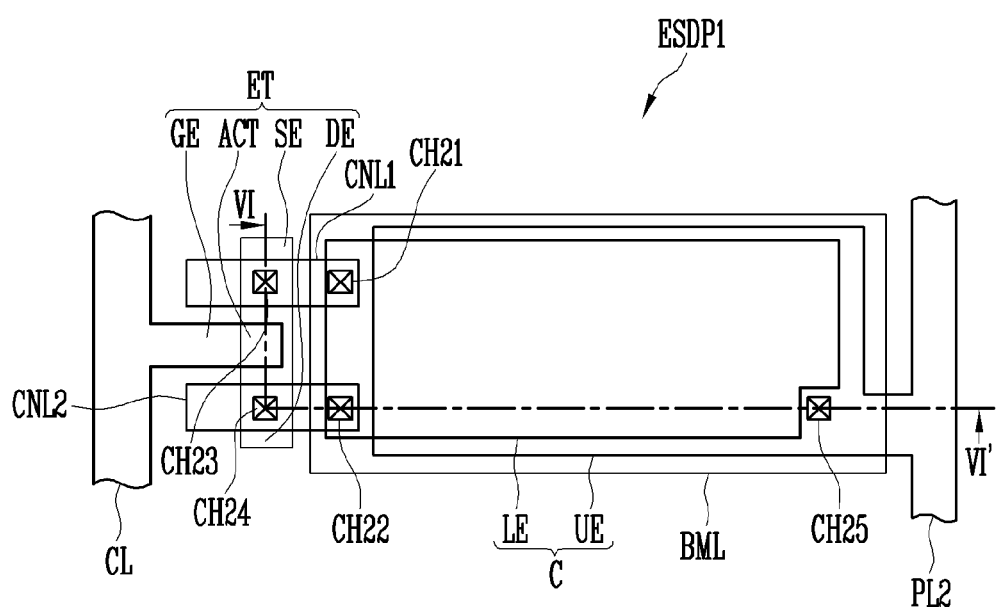
FIG. 14 is a plan view illustrating the first electrostatic discharge portion shown in FIG. 5B in detail.
Figure 14:
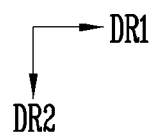
Figure 15:
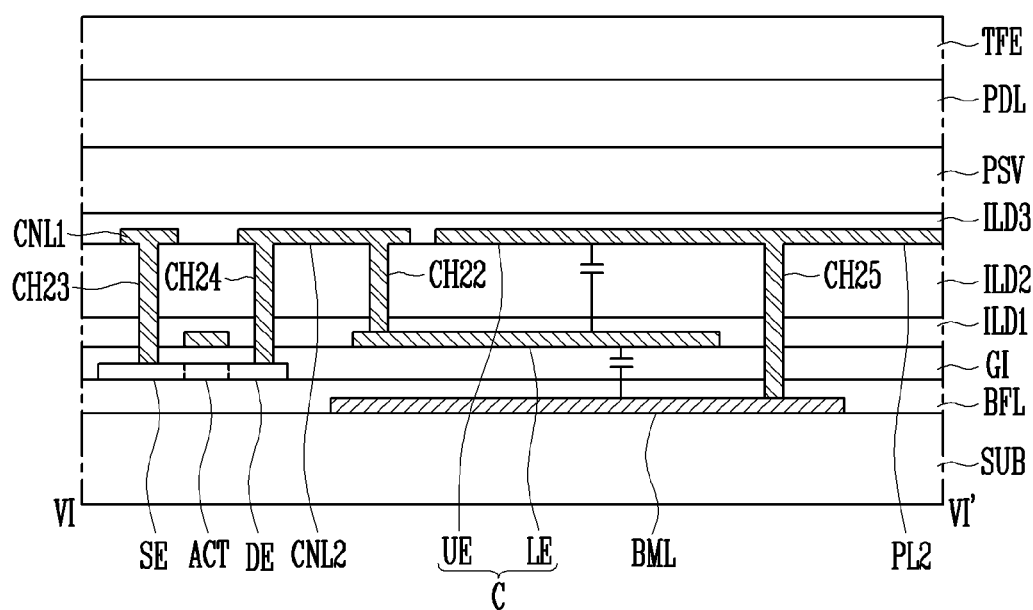
FIG. 15 is a cross-sectional view taken along line VI~VI' of FIG. 14.

FIG. 14 is a plan view illustrating the first electrostatic discharge portion shown in FIG. 5B in detail, and FIG. 15 is a cross-sectional view taken along a line VI~VI' of FIG. 14. In the description, "provided and/or formed in the same layer" may mean being formed in the same process.

Referring to FIGS. 1, 5B, 14, and 15, the first electrostatic discharge portion ESDP1 may be connected between the clock signal line CL and the second power line PL2.

Each of the clock signal line CL and the second power source line PL2 may extend along the second direction DR2. The clock signal provided to the scan driver SDV may be applied to the clock signal line CL and the first driving power ELVDD may be applied to the second power line PL2. The clock signal line CL and the second power source line PL2 may be disposed apart from each other in a plan view.

The first electrostatic discharge portion ESDP1 may include a bottom metal layer BML, a transistor ET, and a capacitor C. The transistor ET may include a gate electrode GE, an active pattern ACT, a source electrode SE, and a drain electrode DE.

The gate electrode GE may be provided in a form protruding along the first direction DR1 from the clock signal line CL. In an example of the disclosure, the gate electrode GE may be integrally provided and/or formed with the clock signal line CL. When the gate electrode GE is provided integrally with the clock signal line CL, the gate electrode GE may be one region of the clock signal line CL.

The active pattern ACT, the source electrode SE, and the drain electrode DE may be formed of a semiconductor layer that is not doped (or injected) with an impurity or doped (or injected) with the impurity. For example, the source electrode SE and the drain electrode DE may be formed of a semiconductor layer doped (or injected) with an impurity, and the active pattern ACT may be formed of a semiconductor layer that is not doped (or injected) with the impurity.

The active pattern ACT may extend along the second direction DR2 and overlap the gate electrode GE in a plan view.

One end of the source electrode SE may be connected to one end of the active pattern ACT. The other end of the source electrode SE may be electrically connected to the first connection wiring CNL1 through the twenty-third contact hole CH23 sequentially passing through the gate insulating layer GI and the first and second interlayer insulating layers ILD1 and ILD2.

One end of the drain electrode DE may be connected to the other end of the active pattern ACT. The other end of the drain electrode DE may be electrically connected to the second connection wiring CNL2 through the twenty-fourth contact hole CH24 sequentially passing through the gate insulating layer GI and the first and second interlayer insulating layers ILD1 and ILD2.

One end of the first connection wiring CNL1 may be connected to the source electrode SE through the twenty-third contact hole CH23. The other end of the first connection wiring CNL1 may be electrically connected to the lower electrode LE through the twenty-first contact hole CH21 sequentially passing through the first and second interlayer insulating layers ILD1 and ILD2.

One end of the second connection wiring CNL2 may be connected to the drain electrode DE through the twenty-fourth contact hole CH24. The other end of the second connection wiring CNL2 may be electrically connected to the lower electrode LE through the twenty-second contact hole CH22 sequentially passing through the first and second interlayer insulating layers ILD1 and ILD2.

The first and second connection wirings CNL1 and CNL2 may be commonly connected to the lower electrode LE.

The capacitor C may include the lower electrode LE and the upper electrode UE.

The lower electrode LE may have a bar shape extending along the first direction DR1 and may be provided and/or formed in the same layer as the gate electrode GE. The lower electrode LE and the gate electrode GE may be provided and/or formed on the gate insulating layer GI. In a plan view, the lower electrode LE and the gate electrode GE may be disposed apart from each other by a predetermined distance.

The upper electrode UE may be provided in a form extending along the first direction DR1 and may be provided integrally with the second power line PL2. When the upper electrode UE is provided integrally with the second power line PL2, the upper electrode UE may be one region of the second power line PL2.

In a plan view, the upper electrode UE may overlap the lower electrode LE and cover the lower electrode LE. The upper electrode UE may overlap the lower electrode LE with the first and second interlayer insulating layers ILD1 and ILD2 interposed therebetween to form the capacitor C. The capacitance of the capacitor C may be increased by widening the overlapping area of the upper electrode UE and the lower electrode LE.

The upper electrode UE may be electrically connected to the bottom metal layer BML through the twenty-fifth contact hole CH25 sequentially passing through the buffer layer BFL, the gate insulating layer GI, and the first and second interlayer insulating layers ILD1 and ILD2.

The bottom metal layer BML may have a bar shape extending along the first direction DR1 with a configuration that is disposed with the first priority on the substrate SUB. The bottom metal layer BML may overlap with each of the lower electrode LE and the upper electrode UE in a plan view.

The bottom metal layer BML may be formed of a conductive material, for example, a metal. The bottom metal layer BML may be formed of a single metal, but may be formed of two or more kinds of metals, or an alloy of two or more kinds of metals. The bottom metal layer BML may be formed as a single layer or a multilayer. The bottom metal layer BML may be provided and/or formed in the same layer as the conductive pattern (refer to CP of FIG. 3) of each of the pixels PXL of the display area DA, and may include the same material as the conductive pattern.

The lower electrode LE may overlap the bottom metal layer BML with the buffer layer BFL and the gate insulating layer GI interposed therebetween to form the additional capacitor. The additional capacitor may increase the capacitance of the capacitor C. As described above, as the capacitance of the capacitor C is increased, the first electrostatic discharge portion ESDP1 may more stably block the static electricity flowed from the outside.

Figure 16:
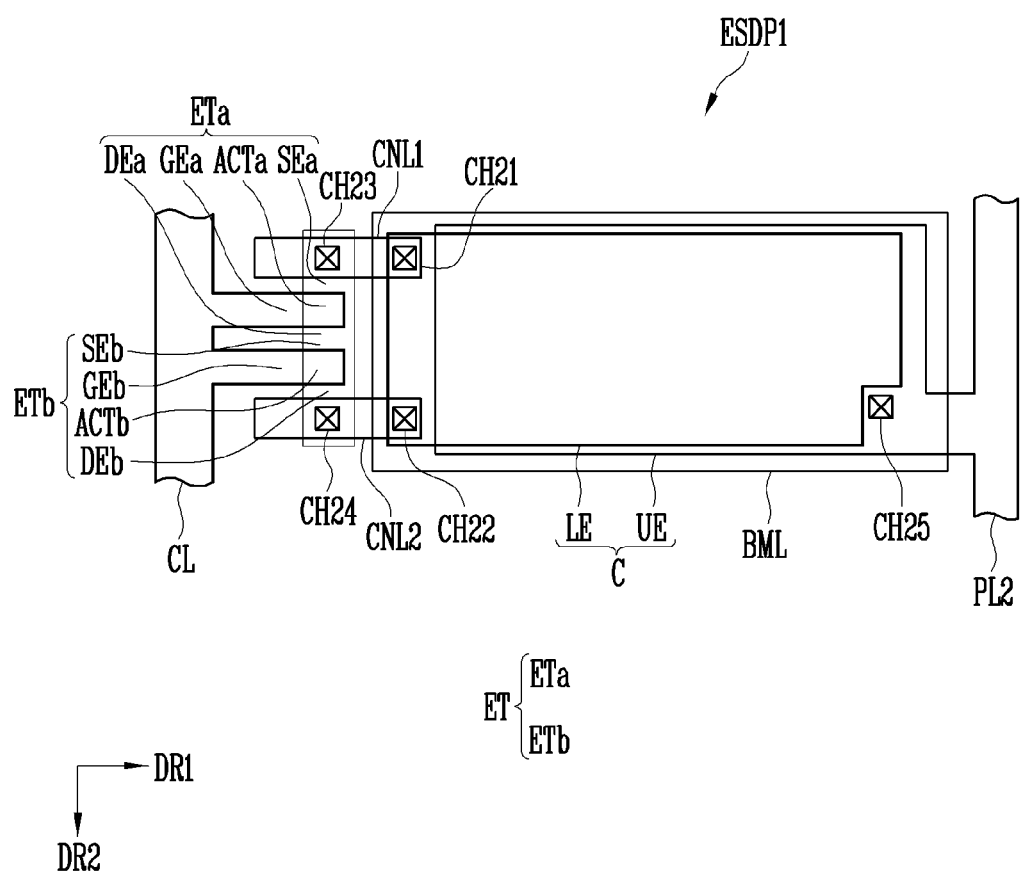
FIG. 16 is a plan view illustrating the first electrostatic discharge portion of FIG. 14 according to another embodiment.

FIG. 16 is a plan view illustrating the first electrostatic discharge portion of FIG. 14 according to another embodiment.

The first electrostatic discharge portion shown in FIG. 16 may have a configuration substantially the same or similar to the first electrostatic discharge portion of FIGS. 14 and 15, except that the first electrostatic discharge portion shown in FIG. 16 includes a transistor of a double gate structure.

In order to avoid repetitive description, the first and second electrostatic discharge portions of FIG. 16 will be described mainly in terms of points different from the above-described embodiment. The parts that are not specifically described in the this embodiment are in accordance with the embodiment described above, the same reference numerals denote the same elements, and the similar reference numerals denote the similar elements.

Referring to FIGS. 1, 5B, and 16, the first electrostatic discharge portion ESDP1 may be connected between the clock signal line CL and the second power line PL2.

Each of the clock signal line CL and the second power source line PL2 may extend along the second direction DR2.

The first electrostatic discharge portion ESDP1 may include the bottom metal layer BML, the transistor ET, and the capacitor C.

The transistor ET may be provided in a double gate structure to prevent a leakage current. For example, the transistor ET may include a first transistor ETa and a second transistor ETb. The first transistor ETa may include a first gate electrode GEa, a first active pattern ACTa, a first source electrode SEa, and a first drain electrode DEa. The second transistor ETb may include a second gate electrode GEb, a second active pattern ACTb, a second source electrode SEb, and a second drain electrode DEb.

Each of the first and second gate electrodes GEa and GEb may be provided in a form protruding along the first direction DR1 from the clock signal line CL. Each of the first and second gate electrodes GEa and GEb may be provided and/or formed integrally with the clock signal line CL to be electrically and/or physically connected to the clock signal line CL. When each of the first and second gate electrodes GEa and GEb is integral with the clock signal line CL, each of the first and second gate electrodes GEa and GEb may be one region of the clock signal line CL.

Each of the first and second active patterns ACTa and ACTb, the first and second source electrodes SEa and SEb, and the first and second drain electrodes DEa and DEb may be formed of a semiconductor layer doped (or injected) with an impurity or a semiconductor layer that is not doped with the impurity. For example, each of the first and second source electrodes SEa and SEb and the first and second drain electrodes DEa and DEb may be formed of a semiconductor layer doped with an impurity, and each of the first and second active patterns ACTa and ACTb may be formed of a semiconductor layer that is not doped with the impurity. The first active pattern ACTa corresponds to a portion overlapped with the first gate electrode GEa and the second active pattern ACTb corresponds to a portion overlapped with the second gate electrode GEb.

One end of the first source electrode SEa may be connected to the first active pattern ACTa and the other end of the first source electrode SEa may be electrically connected to the first connection wiring CNL1 through the twenty-third contact hole CH23. One end of the first drain electrode DEa may be connected to the first active pattern ACTa and the other end of the first drain electrode DEa may be electrically connected to the second source electrode SEb of the second transistor ETb.

One end of the second source electrode SEb may be connected to the second active pattern ACTb and the other end of the second source electrode SEb may be electrically connected to the first drain electrode DEa of the first transistor ETa. One end of the second drain electrode DEb may be connected to the second active pattern ACTb and the other end of the second drain electrode DEb may be electrically connected to the second connection wiring CNL2 through the twenty-fourth contact hole CH24.

One end of the first connection wiring CNL1 may be connected to the first source electrode SEa through the twenty-third contact hole CH23 and the other end of the first connection wiring CNL1 may be electrically connected to the lower electrode LE through the twenty-first contact hole CH21. One end of the second connection line CNL2 may be connected to the second drain electrode DEb through the twenty-fourth contact hole CH24 and the other end of the second connection line CNL2 may be electrically connected to the lower electrode LE through the twenty-second contact hole CH22. For example, the first and second connection wirings CNL1 and CNL2 may be commonly connected to the lower electrode LE.

The capacitor C may include the lower electrode LE and the upper electrode UE.

The lower electrode LE may have a bar shape extending along the first direction DR1. The upper electrode UE may have a bar shape extending along the first direction DR1 and overlap the lower electrode LE. The upper electrode UE may be provided integrally with the second power line PL2. The upper electrode UE may be electrically connected to the bottom metal layer BML through the twenty-fifth contact hole CH25.

The bottom metal layer BML may be a configuration disposed with the first priority on the substrate SUB, but its configuration is not limited thereto. The bottom metal layer BML may have a bar shape extending along the first direction DR1. The bottom metal layer BML may overlap each of the lower electrode LE and the upper electrode UE in a plan view.

The lower electrode LE may overlap the bottom metal layer BML with the buffer layer (refer to BFL of FIG. 15) and the gate insulating layer (refer to GI of FIG. 15) interposed therebetween to form the additional capacitor. The additional capacitor may increase the capacitance of the capacitor C. As described above, as the capacitance of the capacitor C is increased, the first electrostatic discharge portion ESDP1 may more stably block the static electricity from flowing from the outside.

The aforementioned description is provided to exemplify and describe the disclosure. The aforementioned description simply exemplifies and describes the examples of the disclosure, may be applied to various other combinations, modifications, and environments as set forth above, and may be changed or modified within the scope of concept of the disclosure disclosed in the specification, within the scope equivalent to the disclosure contents herein, and/or within the skill or knowledge of those skilled in the art. Accordingly, the above detailed description of the disclosure is not intended to limit the disclosure to the disclosed examples. The appended claims should be construed to include other examples.

What is claimed is:

1. A display device comprising:
    a substrate including a display area and a non-display area;
    a plurality of pixels provided in the display area, at least one pixel of the plurality of pixels including at least one pixel transistor and a light emitting element connected to the at least one pixel transistor;
    a first driver provided in the non-display area and configured to provide a scan signal to the at least one pixel;
    a scan line configured to transfer the scan signal to the at least one pixel;
    a first fan-out line provided in the non-display area and connected to the scan line; and a first electrostatic discharge portion provided in the non-display area and located in an area between the first fan-out line and the scan line,
wherein the first electrostatic discharge portion comprises:
a bottom metal layer comprises a first bottom metal layer and a second bottom metal layer disposed on the substrate; and
a transistor disposed on the bottom metal layer and electrically connected to the bottom metal layer;
wherein the first electrostatic discharge portion comprises:
a first lower electrode disposed on the first bottom metal layer;
a first upper electrode disposed on the first lower electrode;
a second lower electrode disposed on the second bottom metal layer; and
a second upper electrode disposed on the second lower electrode.

2. The display device according to claim 1, wherein the transistor of the first electrostatic discharge portion comprises:
an active pattern disposed on a buffer layer on the substrate;
a gate electrode disposed on the active pattern; and
a source electrode and a drain electrode respectively connected to side portions of a central region overlapping the gate electrode in the active pattern.

3. The display device according to claim 2, wherein:
the first bottom metal layer and the second bottom metal layer between the substrate and the buffer layer, and
the first bottom metal layer and the second bottom metal layer are spaced apart from each other.

4. The display device according to claim 1, wherein:
the first lower electrode and the first upper electrode form a first capacitor with at least one interlayer insulating layer disposed between the first lower electrode and the first upper electrode, and
the second lower electrode and the second upper electrode form a second capacitor with the at least one interlayer insulating layer disposed between the second lower electrode and the second upper electrode.

5. The display device according to claim 4, wherein:
the first bottom metal layer and the first lower electrode form a first additional capacitor with at least one insulating layer positioned under the at least one interlayer insulating layer, the at least one insulation layer being disposed between the first bottom metal layer and the first lower electrode, and
the second bottom metal layer and the second lower electrode form a second additional capacitor with the at least one insulating layer disposed between the second bottom metal layer and the second lower electrode.

6. The display device according to claim 1, wherein the first lower electrode and the second lower electrode are integral with the gate electrode.

7. The display device according to claim 6, wherein the gate electrode, the first lower electrode, and the second lower electrode are located in a same layer as the scan line.

8. The display device according to claim 6, wherein the first upper electrode overlaps the first bottom metal layer, and the second upper electrode overlaps the second bottom metal layer in a plan view.

9. The display device according to claim 8, wherein each of the first and second upper electrodes overlaps a part of the gate electrode in a plan view.

10. The display device according to claim 8, wherein each of the first and second bottom metal layers overlaps a part of the gate electrode in a plan view.

11. The display device according to claim 1, further comprising a power line located in the non-display area and configured to provide driving power to the at least one pixel.

12. The display device according to claim 11, wherein the first electrostatic discharge portion is electrically connected with the first fan-out line and the power line.

13. The display device according to claim 11, wherein:
the first fan-out line is integral with the first upper electrode and is electrically connected to the first bottom metal layer, and
the power line is integral with the second upper electrode and is electrically connected to the second bottom metal layer.

14. The display device according to claim 13, wherein the first electrostatic discharge portion further comprises a first connection wiring electrically connecting the first bottom metal layer and the first fan-out line.

15. The display device according to claim 14, wherein the first connection wiring is located in a same layer as the first and second lower electrodes.

16. The display device according to claim 1, further comprising:
a second driver located in the non-display area and configured to provide a data signal to the at least one pixel;
a data line configured to transfer the data signal to the at least one pixel;
a second fan-out line located in the non-display area and connected to the data line; and
a second electrostatic discharge portion provided in the non-display area and located in an area between the second fan-out line and the data line.

17. The display device according to claim 16, wherein the first upper electrode and the second upper electrode are located in a same layer as the data line.

18. The display device according to claim 17, wherein the second electrostatic discharge portion includes a same structure as the first electrostatic discharge portion.

19. The display device according to claim 2, wherein the first electrostatic discharge portion comprises:
a lower electrode disposed on the bottom metal layer; and
an upper electrode disposed on the lower electrode.

20. The display device according to claim 19, wherein the lower electrode and the upper electrode form a capacitor with at least one interlayer insulating layer disposed between the lower electrode and the upper electrode.

21. The display device according to claim 20, wherein the bottom metal layer and the lower electrode form an additional capacitor with at least one insulating layer positioned under the at least one interlayer insulating layer, the at least one insulating layer being disposed between the bottom metal layer and the lower electrode.

22. The display device according to claim 21, wherein:
the gate electrode is integral with the first fan-out line, and
the lower electrode is located apart from the gate electrode.

23. The display device according to claim 22, wherein the first electrostatic discharge portion further comprises:
a first connection wiring electrically connecting one of the source electrode and the drain electrode with the lower electrode; and
a second connection wiring electrically connecting the other one of the source electrode and the drain electrode with the lower electrode.

24. The display device according to claim 14, wherein the at least one pixel transistor comprises:
- a pixel active pattern disposed on the buffer layer;
- a pixel gate electrode disposed on the pixel active pattern; and
- a first terminal and a second terminal respectively connected to side portions of a center region overlapping the pixel gate electrode in the pixel active pattern.

25. The display device according to claim 24, wherein the at least one pixel further comprises:
- a lower electrode integral with the pixel gate electrode; and
- an upper electrode disposed on the lower electrode,
- wherein the lower electrode and the upper electrode form a storage capacitor with at least one interlayer insulating layer disposed between the lower electrode and the upper electrode.

26. The display device according to claim 25, wherein:
- the at least one pixel further comprises a conductive pattern overlapping the pixel gate electrode, and
- the conductive pattern is located in a same layer as the bottom metal layer.

27. The display device according to claim 26, wherein the at least one pixel further comprises:
- a second connection wiring disposed on the upper electrode and electrically connected to the upper electrode; and
- a bridge pattern provided on the second connection wiring and electrically connected to the second connection wiring.

28. The display device according to claim 27, wherein the light emitting element comprises:
- an anode electrode disposed on the bridge pattern and electrically connected to the bridge pattern;
- a light emitting layer disposed on the anode electrode; and
- a cathode electrode disposed on the light emitting layer.

29. A display device, comprising:
- a substrate including a display area and a non-display area;
- a plurality of pixels provided in the display area, at least one of the plurality of pixels including at least one pixel transistor and a light emitting element connected to the at least one pixel transistor;
- a first driver provided in the non-display area and configured to provide a scan signal to the at least one pixel;
- a second driver provided in the non-display area and configured to provide a data signal to the at least one pixel;
- a scan line configured to transfer the scan signal to the at least one pixel;
- a data line configured to transfer the data signal to the at least one pixel;
- a first fan-out line provided in the non-display area and connected to the scan line;
- a second fan-out line provided in the non-display area and connected to the data line;
- a first electrostatic discharge portion provided in the non-display area and located in an area between the first fan-out line and the scan line; and
- a second electrostatic discharge portion provided in the non-display area and located in an area between the second fan-out line and the data line,
- wherein each of the first and second electrostatic discharge portions comprises:
- a bottom metal layer comprises a first bottom metal layer and a second bottom metal layer disposed on the substrate; and
- a transistor disposed on the bottom metal layer and electrically connected to the bottom metal layer;
- wherein the first electrostatic discharge portion comprises:
- a first lower electrode disposed on the first bottom metal layer;
- a first upper electrode disposed on the first lower electrode;
- a second lower electrode disposed on the second bottom metal layer; and
- a second upper electrode disposed on the second lower electrode.

30. The display device according to claim 29, wherein the second electrostatic discharge portion includes a same structure as the first electrostatic discharge portion.

* * * * *